(12) United States Patent
Geyer et al.

(10) Patent No.: US 11,799,499 B2
(45) Date of Patent: Oct. 24, 2023

(54) METHODS AND APPARATUS FOR ERROR-CORRECTING DIFFERENCE-TRIANGLE-SET PRODUCT CONVOLUTIONAL CODES

(71) Applicant: InterDigital Patent Holdings, Inc., Wilmington, DE (US)

(72) Inventors: Oleksandr Evald Geyer, Toronto (CA); Onur Sahin, London (GB)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

(21) Appl. No.: 17/287,723

(22) PCT Filed: Oct. 22, 2019

(86) PCT No.: PCT/US2019/057309
§ 371 (c)(1),
(2) Date: Apr. 22, 2021

(87) PCT Pub. No.: WO2020/086502
PCT Pub. Date: Apr. 30, 2020

(65) Prior Publication Data
US 2021/0399832 A1 Dec. 23, 2021

Related U.S. Application Data

(60) Provisional application No. 62/899,850, filed on Sep. 13, 2019, provisional application No. 62/748,724, filed on Oct. 22, 2018.

(51) Int. Cl.
*H03M 13/29* (2006.01)
*H04L 1/00* (2006.01)
*H04B 1/38* (2015.01)

(52) U.S. Cl.
CPC ...... *H03M 13/2939* (2013.01); *H04L 1/0059* (2013.01); *H04B 1/38* (2013.01)

(58) Field of Classification Search
CPC .................................................. H03M 13/1154
See application file for complete search history.

(56) References Cited

U.S. PATENT DOCUMENTS

2010/0122149 A1 5/2010 Coe
2011/0113301 A1* 5/2011 Limberg ............... H04L 1/0045
714/755

(Continued)

OTHER PUBLICATIONS

Smith, Benjamin et al., "Leveraging 400G ZR FEC Technology", Inphi, IEEE Beyond 10km Optical PHYs Study Group, Orlando, FL, USA, Nov. 8-9, 2017, 10 pages.

(Continued)

*Primary Examiner* — Joseph D Torres
(74) *Attorney, Agent, or Firm* — Jamie T. Nguyen

(57) ABSTRACT

Methods, apparatus, systems, architectures and interfaces for encoding/decoding a QD-DTS-PrCC are provided. The decoding method includes determining a number $k_{TS}$ of input bits included in a transmission of a data stream and a first bit of the input bits included in the transmission in the data stream; determining a number of Encoded Bit Blocks (EBBs), each of the EBBs including any number of data blocks that are previously transmitted Transmit Segments (TS) of the data stream, each of the data blocks having a bit length of $k_{TS}$ bits; selecting that number of EBBs for encoding a QD-DTS-PrCC component codeword (QDCC) of the transmission according to a DTS indexing method for indexing a plurality of EBBs; generating the QDCC including a TS, Virtual Segments (VSs), and $r_c$ parity bits, a dimensionality of the QD-DTS-PrCC being at least 2; and extracting the calculated TS of the QDCC to an output EBB.

19 Claims, 14 Drawing Sheets

(56) References Cited

U.S. PATENT DOCUMENTS

| | | | |
|---|---|---|---|
| 2012/0063443 A1* | 3/2012 | Park | H04H 60/00 370/345 |
| 2012/0236922 A1* | 9/2012 | Jeong | H03M 13/356 375/232 |
| 2012/0266051 A1 | 10/2012 | Farhoodfar et al. | |

OTHER PUBLICATIONS

Zhang, Lei, Analysis and Design of Staircase Codes for High Bit-Rate Fiber-Optic Communication, Graduate Thesis, University of Toronto, 2017, 138 pages.

Smith, Benjamin P., "Error-Correcting Codes for Fibre-Optic Communication Systems", 2011, 127 pages.

Deutschmann, Martin et al, "D1.2 B5G Wireless Tb/s FEC KPI Requirement and Technology Gap Analysis", EPIC, Mar. 16, 2018, 84 pages.

Jian, Yung-Yih, et al., "Iterative Hard-Decision Decoding of Braided BCH Codes for High-Speed Optical Communication", Globecom 2013—Optical Networks and Systems Symposium, 6 pages.

Janvars, Tomas, et al., "On Decoding of Multidimensional Single Parity Turbo Product Codes", Faculty of Electrical Engineering and Information Technology, Slovak Technical University in Bratislava, 2003 IEEE, pp. 25-28.

Medina, C., et al., "Error Exponents for Product Convolutional Codes", Problems of Information Transmission, 2006, vol. 42, No. 3. Pleiades Publishing, Inc., 2006, pp. 167-182.

Baggen, C.P.M.J. et al., "On Diamond Codes", IEEE Transactions on Information Theory, vol. 43, No. 5, Sep. 1997, 12 pages.

Hu, Guanghi et al., "Tail-Biting Code: A Modification to Staircase Code for High-Speed Networking", 2015 IEEE, 5 pages.

Feltstrom, Alberto Jiminez et al., "Braided Block Codes", IEEE Transactions on Information Theory, vol. 55, No. 6, Jun. 2009, 19 pages.

Vitesse Semiconductor (USA), "Proposed Addition of CI-BCH eFEC to G.975.1", International Telecommunication Union, ITU Telecommunication Standardization Sector, Study Period 2009-2012, COM 15—C 508-E, Sep. 2009, 8 pages.

Klove, Torleiv, "Bounds and Construction for Difference Triangle Sets", IEEE Transactions on Information Theory, vol. 35, No. 4, Jul. 1989, 9 pages.

Pyndiah, "Near-optimum decoding of product codes: block turbo codes," IEEE Transactions on Communications, vol. 16, No. 8, pp. 1003-1010 (Aug. 1998).

Fougstedt, Christoffer et al., "Energy-Efficient High-Throughput Staircase Decoders", Optical Society of America, 2018, 3 pages.

Zhang, Lei M., "Staircase Codes with 6% to 33% Overhead", Journal of Lightwave Technology, vol. 32, No. 10, May 15, 2014, 4 pages.

Cai, Yi, et al., "FPGA Investigation on Error-Floor Performance of a Concatenated Staircase and Hamming Code for 400G-ZR Forward Error Correction", Optical Society of America, OFC 2018, 3 pages.

Zhang, Wei, et al., "Braided Convolutional Codes: A New Class of Turbo-Like Codes", IEEE Transactions on Information Theory, Accepted for Publication, 2010, 17 pages.

Robinson, John P. et al., "A Class of Binary Recurrent Codes with Limited Error Propagation", IEEE Transactions on Information Theory, vol. IT-13, No. 1, Jan. 1967, 8 pages.

Massey, James L., "Threshold Decoding", Technical Report 410, Massachusetts Institute of Technology, Cambridge, Massachusetts, Apr. 5, 1963, 134 pages.

Scholten, Michael et al., "Continuously-Interleaved BCH (CI-BCH) FEC delivers best in class NECG for 40G and 100G metro applications", OSA/OFC/NFOEC IEEE, 2010, 3 pages.

Justesen, Jorn, "Performance of Product Codes and Related Structures with Iterated Decoding", IEE Transactions an Communications, vol. 59, No. 2, Feb. 2011, 9 pages.

Smith, Benjamin, et al., "Staircase Codes: FEC for 100 GB/s OTN", IEEE/OSA Journal of Lightwave Technology, 2011 IEEE, Jan. 19, 2012, 8 pages.

Fen, Bowen, et al., "A Novel High-Rate Polar-Staircase Coding Scheme", IEEE 88th Vehicular Technology Conference (VTC-Fall), May 25, 2018, 6 pages.

Lentmaier, Michael et al., "Braided Convolutional Codes—A Class of Spatially Coupled Turbo-Like Codes", IEEE, 2014, 5 pages.

Fuja, "Cross Parity Check Convolutional Codes", IEE Transactions on Information Theory, vol. 35, No. 6, Nov. 1989, 13 pages.

Hager, Christian et al., "On Parameter Optimization for Staircase Codes", OFC 2015, Optical Society of America, 3 pages.

Zhang, Lei M. et al., "Complexity-Optimized Concatenated LDGM-Staircase Codes", 2017 IEEE International Symposium on Information Theory (ISIT), 5 pages.

ITU; "Flexible OTN long-reach interfaces" Series G: Transmission Systems and Media, Digital Systems And NETWORKSDigital terminal equipments—General, Series Y: Global Information Infrastructure, Internet Protocol Aspects, Next-Generation Networks, Internet of Things and Smart Cities, Internet protocol aspects—Transport, Jun. 2018, 34 pages.

Shea and Tan; "Multidimensional codes," in Wiley Encyclopedia of Telecommunications, v. 3, 2003, 16 pages.

Rankin and Gulliver; "Single Parity Check Product Codes", IEEE Transactions On Commnicatiions, vol. 49, No. 8, Aug. 2001, 9 pages.

ITU; "OTU4 long-reach interface", Series G: Transmission Systems and Media, Digital Systems and Networks, Digital terminal equipments—General, Series Y: Global Information Infrastructure, Internet Protocol Aspects, Next-Generation Networks, Internet of Things and Smart Cities Internet protocol aspects—Transport, Jul. 2018, 64 pages.

Atkinson et al.; "Integer Sets with Distinct Sums and Differences and Carrier Frequency Assignments for Nonliner Repeaters", IEEE Transactions On Communications, vol. COM-34, No. 6, Jun. 1986, 4 pages.

Vitesse Semiconductor (USA); "Proposed Addition of CI-BCH eFEC to G.975.1", International Telecommunication Union, Telecommunication Standardization Sector, Com 15—C 508—E, Sep. 2009, 8 pagesSTUDY PERIOD 2009-2012.

ITU; "Flexible OTN long-reach interfaces", Amendment 1, Series G: Transmission Systems and Media, Digital Systems And NETWORKSDigital terminal equipments—GeneralSERIES Y: Global Information Infrastructure, Internet Protocol Aspects, Next-Generation Networks, Internet of Things and Smart Cities, Internet protocol aspects—Transport, Nov. 2018, 74 pages.

Elias, Peter, "Error-Free Coding", Department of Electrical Engineering and Research Laboratory of Electronics, MIT, Dec. 2013, 9 pages.

* cited by examiner (a)            (b)

A Parity-check Bit

\*   A Bit of the Component Codeword Equals to One; Other Bits are Equal to Zero

METHODS AND APPARATUS FOR ERROR-CORRECTING DIFFERENCE-TRIANGLE-SET PRODUCT CONVOLUTIONAL CODES

CROSS REFERENCE TO RELATED APPLICATIONS

This application is the National Stage entry under 35 U.S.C. § 371 of Patent Cooperation Treaty Application PCT/US2019/57309, filed Oct. 22, 2019 and claims the benefit of U.S. Provisional Application No. 62/748,724, filed Oct. 22, 2018 and U.S. Provisional Application No. 62/899, 850 filed Sep. 13, 2019, the contents of each are incorporated by reference herein.

BACKGROUND

The present invention relates to the field of communications and, more particularly, to methods, apparatus, systems, architectures and interfaces for communications in an advanced or next generation wireless communication system, including communications carried out using a new radio and/or new radio (NR) access technology and communication systems. Designing error-correcting codes, such as product codes, product convolutional codes, etc., for ultra-high-speed communication may be challenging due to requirements including: high data rates (e.g., more than 500 Gb/s, and in some cases, more than 400 Gb/s), low latency, redundancy, small power consumption, large coding gain, etc.

BRIEF DESCRIPTION OF THE DRAWINGS

In the accompanying drawings, like reference numerals in the figures indicate like elements, and wherein.

EXAMPLE NETWORKS FOR IMPLEMENTATION OF THE EMBODIMENTS

Figure 1A:
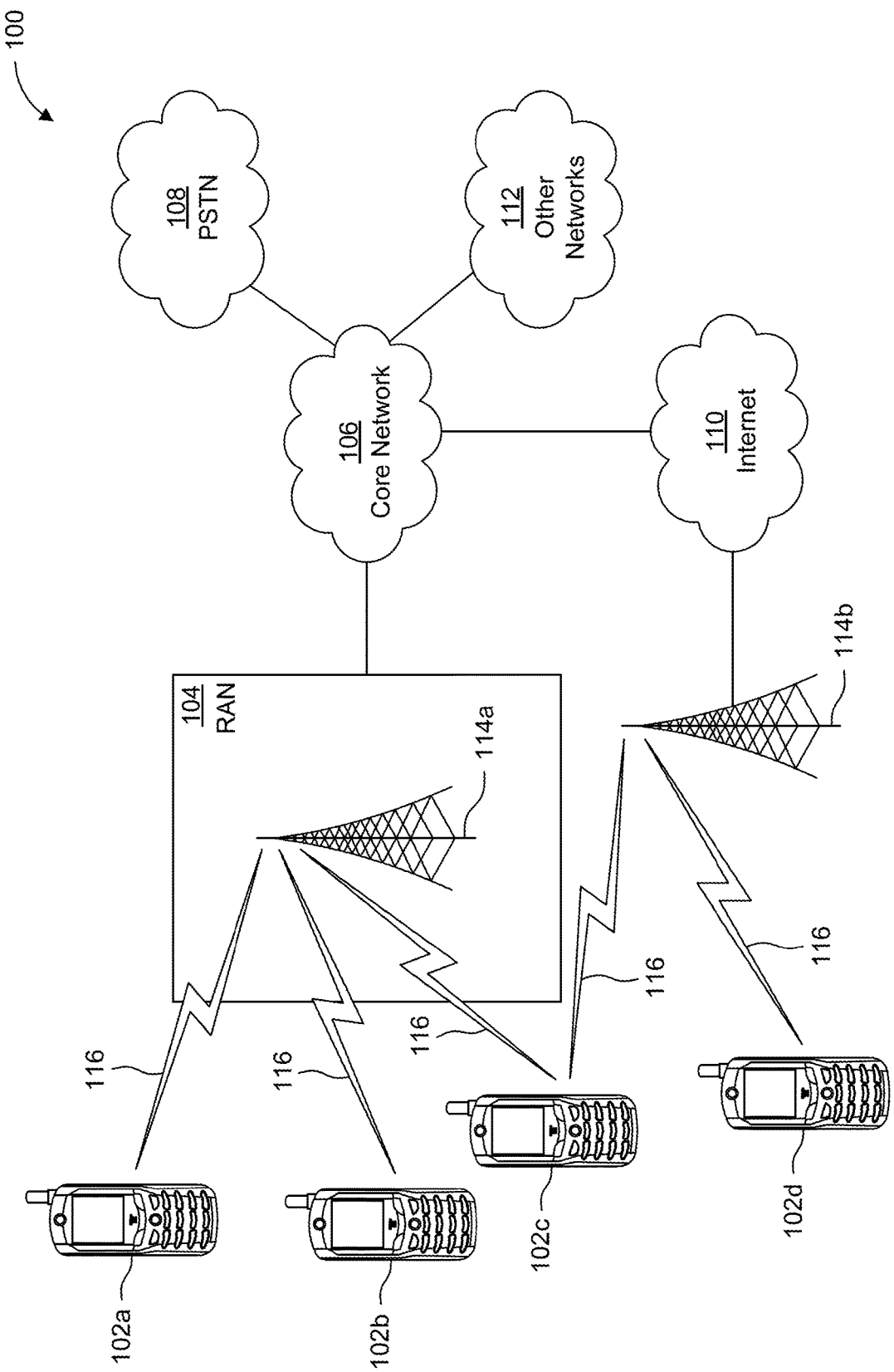
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1x, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 1A may be configured to communicate with the base station 114a, which may employ a cellular-based radio technology, and with the base station 114b, which may employ an IEEE 802 radio technology.

Figure 1B:
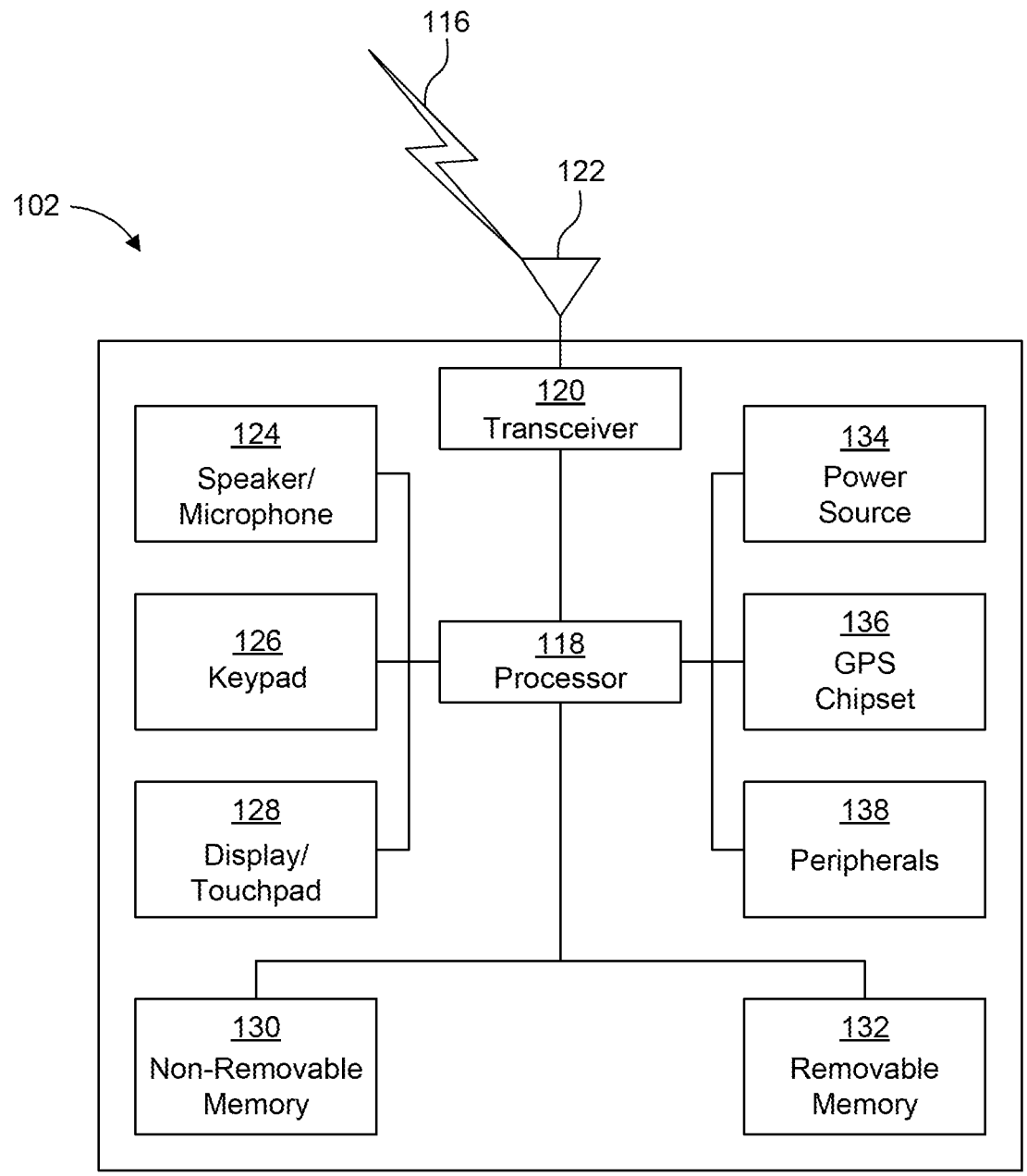
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WTRU 102 may include a half-duplex radio for which transmission and reception of some or all of the signals (e.g., associated with particular subframes for either the UL (e.g., for transmission) or the downlink (e.g., for reception)).

Figure 1C:
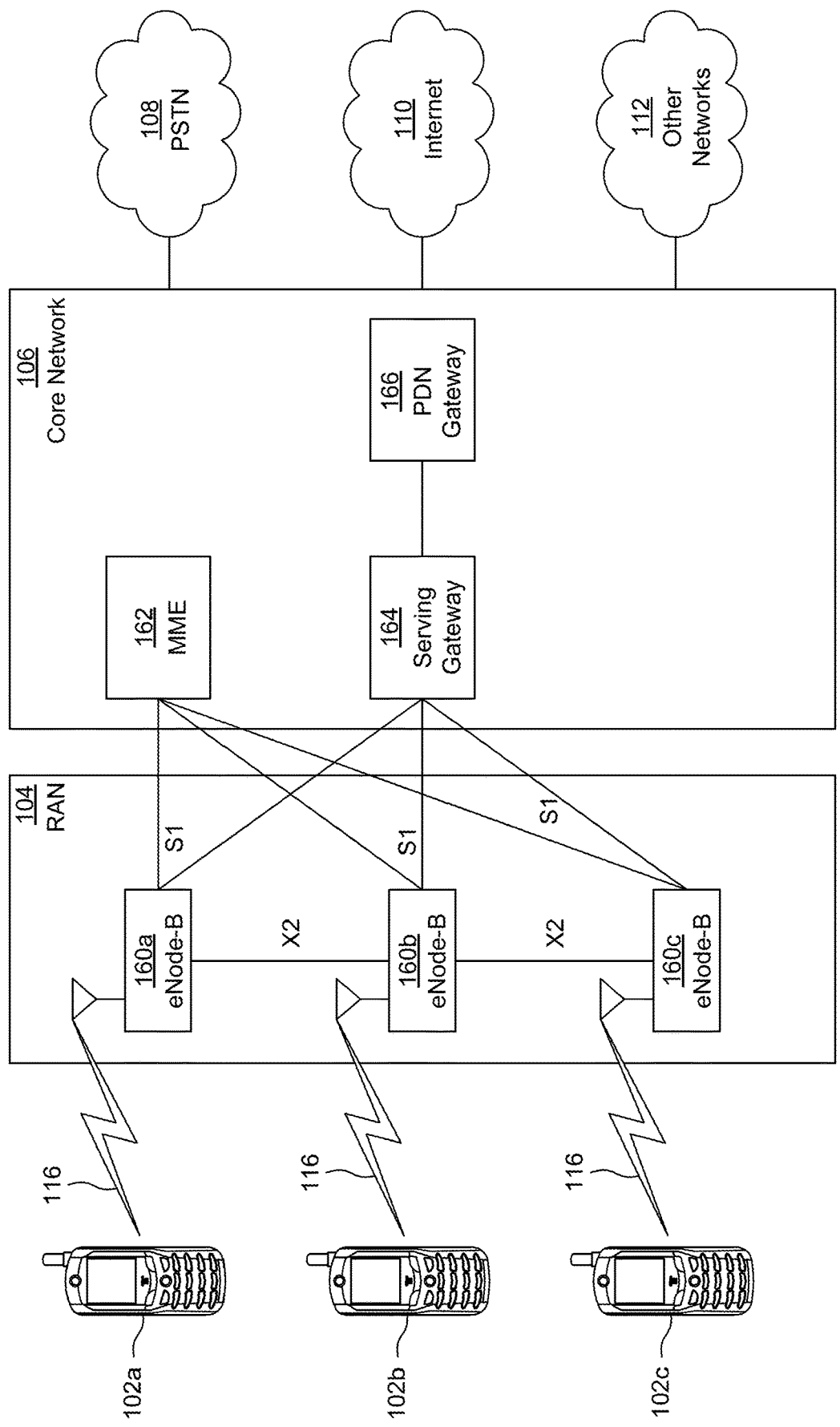
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Figure 10:
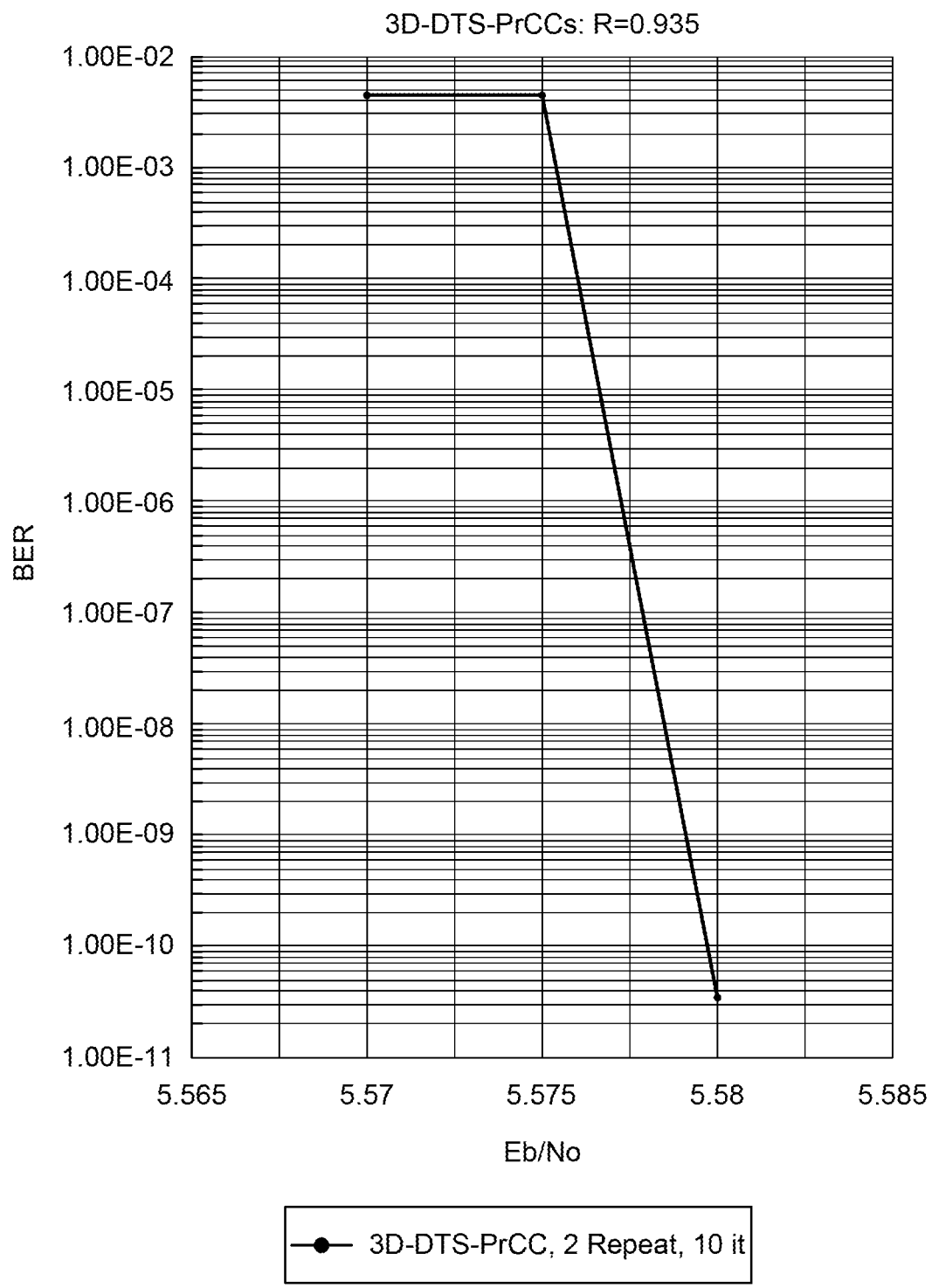
FIGS. 10 and 11 are diagrams illustrating simulation results of bit error rate (BER) performance of the 3D-DTS-PrCCs according to embodiments.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 10, the eNode-Bs 160a, 160b, 160c may communicate with one another over an X2 interface.

The CN 106 shown in FIG. 10 may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 160a, 160b, 160c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum.

According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
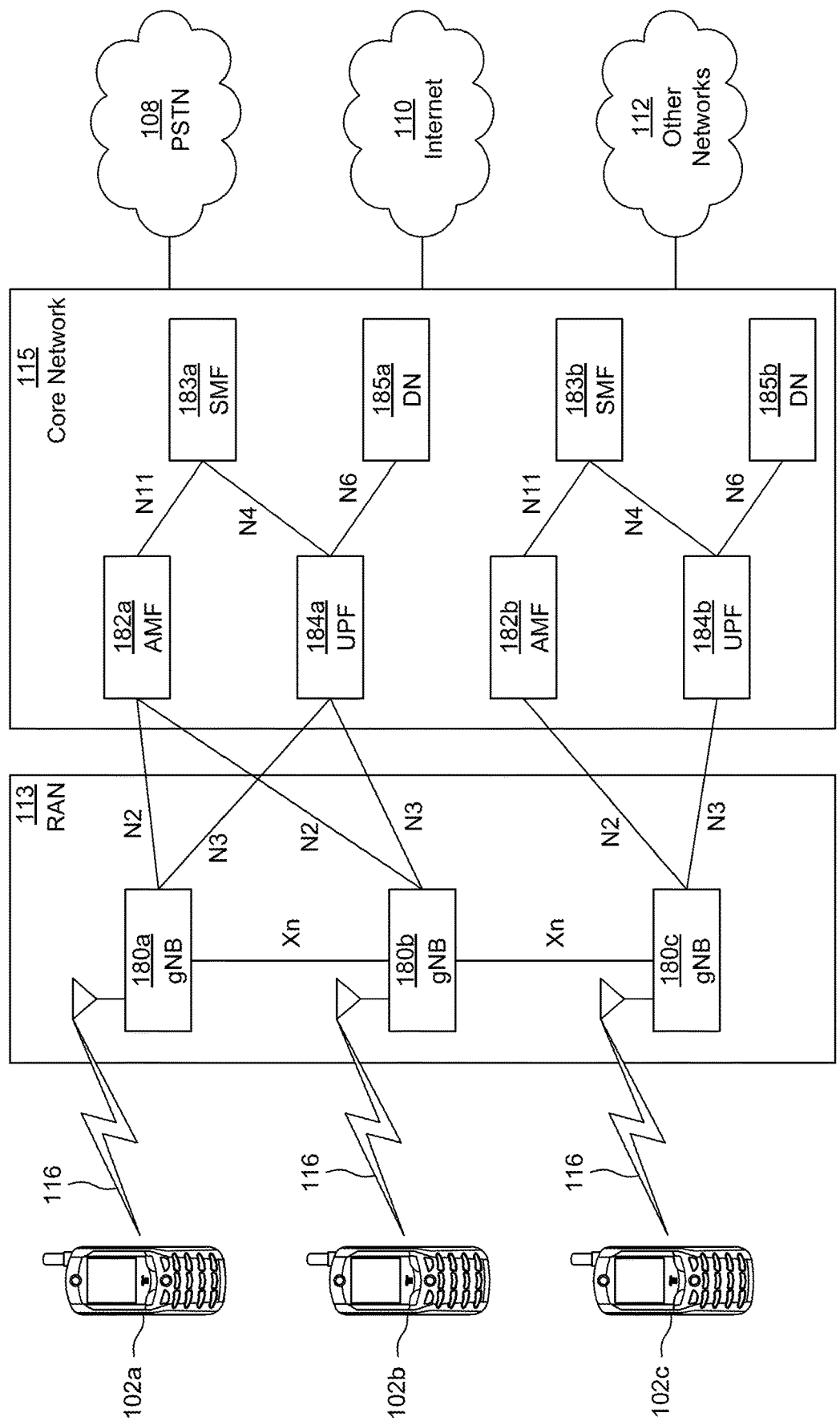
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a,184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-b, UPF 184a-b, SMF 183a-b, DN 185a-b, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

DETAILED DESCRIPTION

Product Convolutional Codes

Product convolutional codes, which may be referred to and/or considered as a type of product code, may be applied to (e.g., used, considered, etc., for) a case of ultra-high-speed applications. For example, new classes of product-like codes, that is, codes that are like and/or similar to product codes, have been proposed, such as a Bose, Chaudhuri, and Hocquenghem (BCH) code. These product-like codes may provide a high coding gain, a small decoding complexity, and a high throughput.

Product convolutional codes may be associated with types or classes of codes, such as two-dimensional staircase codes, continuously-interleaved codes, and braided codes, which may be used in the case of ultra-high-speed communications. Both staircase codes and continuously-interleaved codes may use component block codes.

The minimal distance of the staircase codes is equal to the product of minimal distances of the component codes. Staircase codes may provide better performance than many other continuously-interleaved codes. Staircase codes are used independently or as outer codes of a concatenated soft-decision forward error correction (FEC), for example, in a case of International Telecommunication Union (ITU) standards for ultra-high throughput systems.

Continuously-interleaved codes, such as a BCH code, with hard-decision iterative decoding may provide performance that is close to the capacity of a binary symmetric channel. However, practical and theoretical interest to this class of codes is diminishing in view of introduction of the staircase codes, for example, due to staircase codes having (e.g., generally, as a rule, etc.) better performance.

As noted above, a class of product convolutional codes includes braided codes, which may also be referred to as braided block codes and which may be classified as two-dimensional product-like codes. Braided block codes may not achieve good bit-error-rate (BER) performance, and thus, they may not be better than (e.g., competitive with) staircase codes. For example, a braided block code with an overhead of 6.25% may provide a smaller coding gain than that of the staircase code and may have an error-floor.

Multidimensional block product codes, which may also be referred to as Q-dimensional block product codes, have not produced as much practical and theoretical interest as that of the 2-dimensional ones. As an example of why there is a lack of interest, for the case of conventional Q-dimensional block product codes, their code length n_c^Q grows exponentially with a raise of dimensionality of the code Q, where n_c is a length of component block codes. There are investigation results of low-rate (e.g., turbo) product codes with short component codes or single-parity check codes. However, such short component codes or single-parity check codes significantly limits an area of application of such low-rate (e.g., turbo) product codes and their coding gain. That is, for example, to provide a proper coding gain in a case of small redundancy typical for ultra-high speed systems, component codes of a certain length, such as 256-1000, should be used. However, the length of the multidimensional block product code is prohibitive for implementation in such a case. Further, multi-dimensional product convolutional codes are not well represented or discussed in the area of channel coding.

With respect to developing (e.g., future, new, non-conventional) FEC technologies, there is a need to develop error-correcting codes that may achieve high throughputs (e.g. >500 Gbps, and/or >400 Gbps) in view of several different use-case constraints, including decoding complexity, power consumption, latency, and/or (e.g., a proper) error-correcting performance. However, there are drawbacks for product and/or product-like convolutional codes, such as the staircase, continuously-interleaved, and braided codes, and the drawbacks may limit applicability of such codes to practical telecommunication use-cases, and particularly wireless systems.

For example, such drawbacks may include: (1) a minimum distance of two-dimensional codes is equal to the product of minimal distances of the component codes; in the case of component codes with small minimal distance, the resulting minimal distance of the two-dimensional product convolutional codes can be insufficient for providing a proper coding gain and required error-floor, and such constrains use of two-dimensional codes with component codes with small minimal distance; (2) staircase codes have high decoding complexity and power consumption that may be prohibitive for high-throughput systems; and (3) staircase codes provide limited code-rate flexibility. The decoding latency of staircase codes may limit use of staircase codes when there is a maximum permitted latency and may limit the throughput of the FEC. That is, staircase codes may include large numbers of component block codes. For example, implementation of iterative decoding of such large numbers of component codes may proportionally need (e.g., require) a large number of component code decoders, resulting in prohibitive decoding latency. Any of the decoding complexity or the power consumption of staircase codes may be prohibitive in the case of high-throughput systems, because staircase codes may use (e.g., need, require, etc.) large numbers of decoders for the component block codes.

Complexity of component code decoders may be a (e.g., dominating) factor for (e.g., overall) decoding complexity. Further, the power consumption of iterative decoding of the staircase codes, and the large number of complex (i.e., complicated) component code decoders, may be prohibitive for the high-throughput systems. Additionally, as noted above, staircase codes provide limited code-rate flexibility. For example, in the case of high-throughput systems, an option (e.g., feature, ability, flexibility, operational ability, parameter, etc.) of choosing a code rate may be required. In such as case, encoding and decoding schemes having (e.g., that support, high) code rate flexibility may be used (e.g., preferred), especially in varying use cases of interest and in view of adaptation to variations of a channel environment. However, staircase codes do not have or have limited ability for (e.g., opportunities of) changing the minimal distance, length and the rate of the code because they are, as a rule, significantly limited by the design constraints of these classes/types of codes.

Q-Dimensional Difference Triangle Set Product Convolutional Codes

According to embodiments, there may be a Q-Dimensional Difference-Triangle Set (QD-DTS)-Product Convolutional Code (PrCC), which may be a (e.g., new) class and/or a (e.g. new) type of product convolutional codes. According to embodiments, a QD-DTS-PrCC may (e.g., significantly) reduce decoding complexity and/or latency as compared to other types of product convolutional codes. According to embodiments, a QD-DTS-PrCC may provide pre-served and/or improved error-correction performance. Further, according to embodiments, a QD-DTS-PrCC may allow for higher throughputs and/or smaller decoding complexity for the use cases and associated constraints of interest.

Encoder Structure

Figure 2:
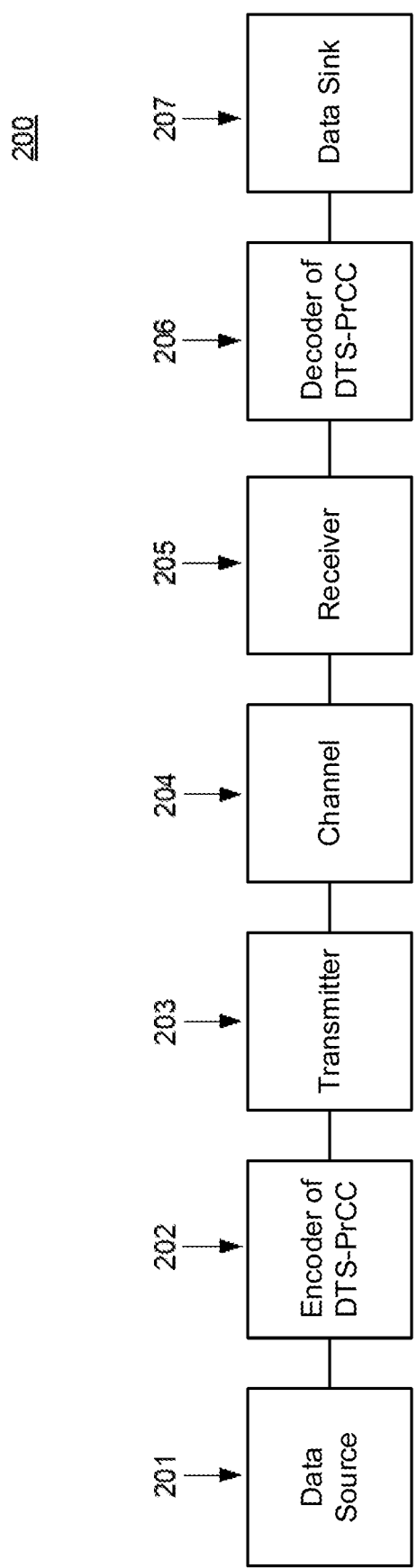
FIG. 2 is a diagram illustrating a communication system including QD-DTS-PRCCs according to embodiments.

FIG. 2 is a diagram illustrating a communication system including QD-DTS-PRCCs according to embodiments.

Referring to FIG. 2, a communication system 200 may include a data source 201 that provides the data to be encoded. An encoder 202, for example, providing and/or performing QD-DTS-PrCC encoding, may encode data and form an encoded stream (e.g., of the encoded data). The encoded stream may be transmitted by a transmitter 203 over a communication channel 204. A receiver 205 receives a stream via the channel, wherein the stream may be generally (i.e., typically) corrupted by noise and other sources, e.g. interference, in the communication channel 204. A decoder 206, that may provide QD-DTS-PrCC decoding, decodes the received stream to recover the transmitted data and provides this data to a data sink 207.

Figure 3:
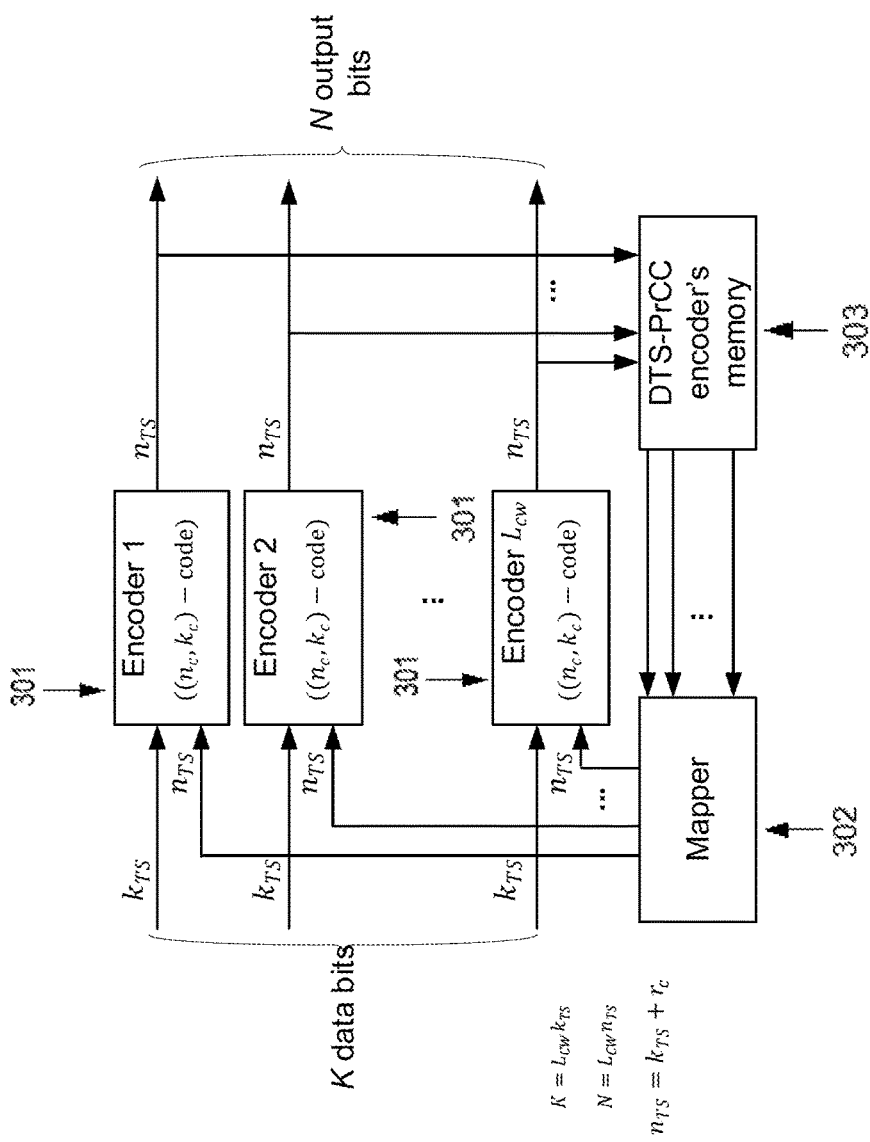
FIG. 3 is a diagram illustrating a QD-DTS-PRCC encoder according to embodiments.
Figure 4:
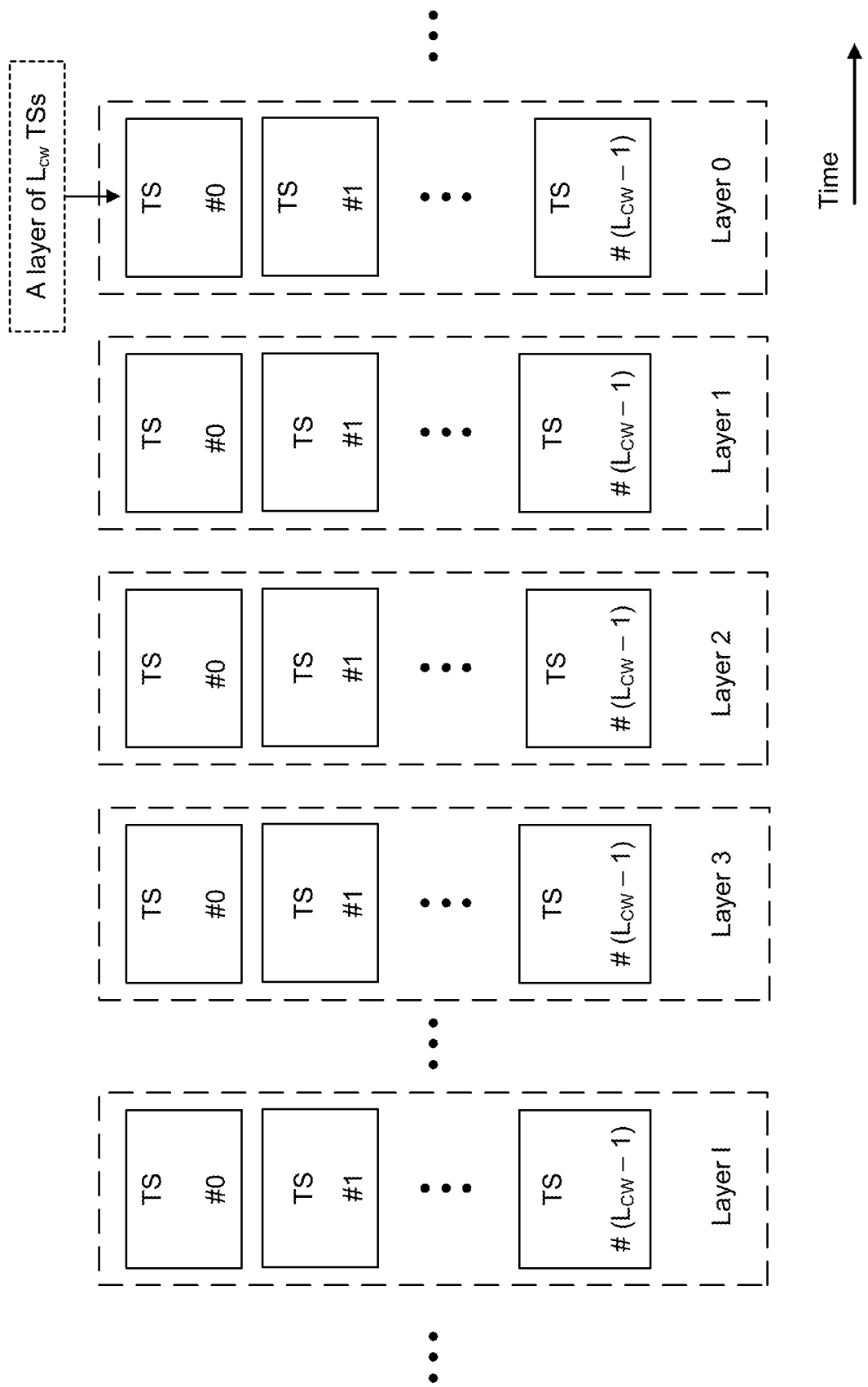
FIG. 4 is a diagram illustrating an encoded stream according to embodiments.

FIG. 3 is a diagram illustrating a QD-DTS-PRCC encoder according to embodiments; and FIG. 4 is a diagram illustrating an encoded stream according to embodiments.

According to embodiments, a QD-DTS-PrCCs may be encoded by an encoder, for example a systematic recursive convolutional encoder. Referring to FIG. 3, there may be an encoder 300 (e.g., a generalized encoder) of a QD-DTS-PrCC, wherein $k_{TS}$ and $n_{TS}$ denote the number of data (e.g. information) and encoded bits, respectively at the input and output of each of $L_{cw}$ encoders 301 of the component block codes of the QD-DTS-PrCC. According to embodiments, the encoder 300 may include any number of $L_{cw}$ encoders 301, a mapper 302, and a memory 303. The number K of the input data and the n umber N of the output encoded bits of the QD-DTS-PrCC encoder may be respectively calculated according to Formulas 1 and 2:

$$K = L_{cw} k_{TS} \qquad \text{[Formula 1]};$$

$$N = k_v n_{TS} \qquad \text{[Formula 2]}.$$

According to embodiments, systematic $(n_c, k_c)$ block codes may be used as component codes of a QD-DTS-PrCC, wherein $n_c$ and $k_c$ are respectively the length and the dimension of the component block code. According to embodiments, it may be needed (e.g., preferred, required, etc.) that $n_c = 2 \cdot n_{TS}$ for some integer $n_{TS}$, wherein the integer $n_{TS}$ denotes any of a length of a transmitted segment (TS) and dimensionality of a code Q. According to embodiments, a code rate $R_c$ of a component code may be determined according to Formula 3:

$$R_c \triangleq k_c/n_c \quad \text{[Formula 3]}$$

According to embodiments, a number of parity bits $r_c$ in each component codeword may be determined according to Formula 4:

$$r_c \triangleq n_c - k_c \quad \text{[Formula 4]}$$

According to embodiments, any of and/or all the solutions, embodiments, and/or features disclosed herein for the QD-DTS (e.g., new, non-conventional, etc.) class of product convolutional codes (e.g., the QD-DTS-PrCCs) may be applied to any of binary and nonbinary systematic component blocks codes.

Referring to FIG. 4, an encoded bit stream may be at (e.g., outputted by, stored at, available at, etc.) the output of the encoder 300 of FIG. 3. According to embodiments, a bit block of length N output by a (e.g., at the output of a) QD-DTS-PrCC encoder, such as the encoder 300, may be an encoded bit block (EBB). Hereinbelow, an EBB may be interchangeably referred to as a layer, such that figures, disclosure, examples, etc., may interchangeably refer to an EBB and a layer). According to embodiments, each EBB may consist of $L_{cw}$ transmitted segments (TSs). Referring to FIG. 4 and throughout this disclosure, a same numbering (e.g. indexing) is illustrated and referred to for indicating TSs in each layer as well as component codewords used to generate the TSs.

According to embodiments, there may be a relationship between successive blocks (e.g., groups, units, sets, etc.) of K input data bits from the streaming data source and the output stream of the EBBs. According to embodiments, a QD-DTS-PrCC may be (e.g., completely) characterized by a relationship between successive blocks of K input data bits from the streaming data source and the output stream of the EBBs. According to embodiments, an encoder's memory (e.g., of the QD-DTS-PrCC) may store m consecutive previously encoded EBBs, for example, to be used during the encoding process, wherein m is a maximal degree of generator polynomials of the QD-DTS-PrCC. According to embodiments, the m previously encoded EBBs stored in memory may be initialized to a reference state, such as a reference state known to the encoder-decoder pair. For example, the m EBBs stored in the encoder's memory may be initialized to an all-zeros state.

According to embodiments, rules may (e.g., be used to) define a QD-DTS-PrCC. According to embodiments, a mapper may map a QD-DTS-PrCC in accordance with rules which define the QD-DTS-PrCC. For example, a QD-DTS-PrCC mapper, such as a mapper 302 of FIG. 3, may fill, or in other words, may map, bits of the previously encoded EBBs stored in the encoder's memory to (e.g., proper, corresponding) bit positions of codewords of the component codes in the currently encoded EBB according to specific rules defining the QD-DTS-PrCC.

Figure 5:
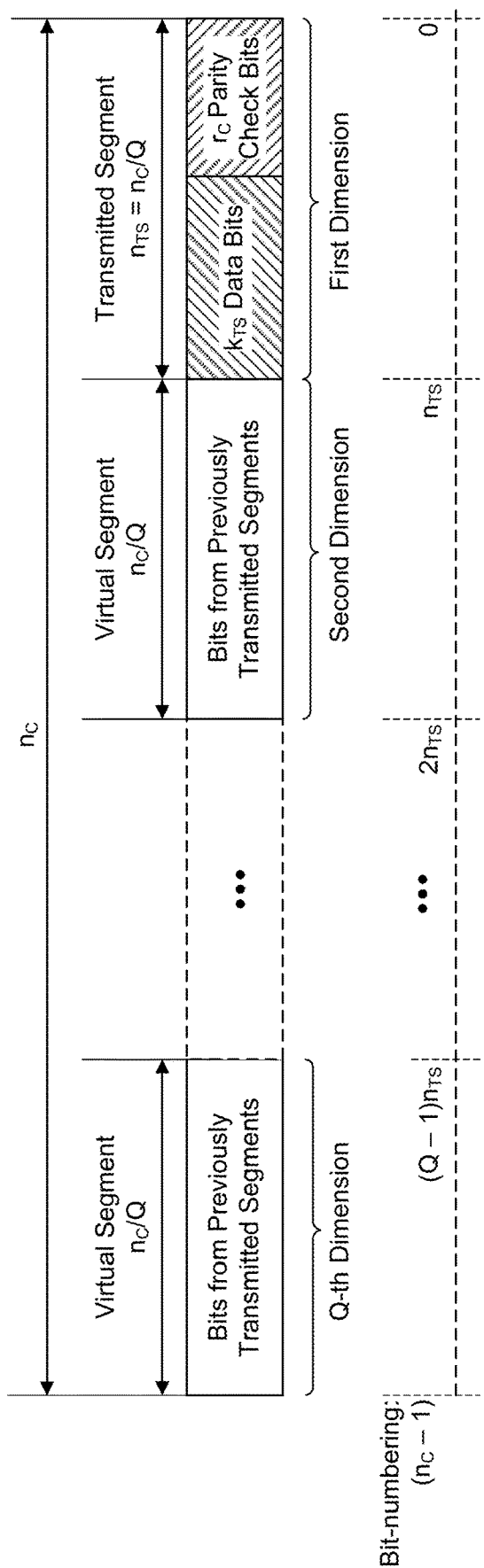
FIG. 5 is a diagram illustrating a format of a codeword of a component code according to embodiments.

FIG. 5 is a diagram illustrating a format of a codeword of a component code according to embodiments.

Referring to FIG. 5, a codeword of a component code may have a length of $n_c$ bits and may have $r_c$ parity-check bits. According to embodiments, a codeword may have at least Q segments, including a transmitted segment (TS) 501 and a virtual segments (VS) 502. According to embodiments, a TS 501 and a VS 502 (e.g., of a codeword) may have a same length, such as, for example, each having a length $$\frac{n_c}{Q},$$

wherein Q denotes a dimensionality of a QD-DTS-PrCC. According to embodiments, a TS 501 may be filled by (e.g., by mapping)

$$k_{TS} = \left(\frac{n_c}{Q} - r_c\right)$$

data bits from the data source and $r_c$ parity-check bits calculated using $k_c = (n_c - r_c)$ bits corresponding to (e.g., of) the component codeword. According to embodiments, the filling of (e.g., the mapping to) a TS 501 may be (e.g., done, performed, etc.) in accordance with an encoding procedure of a component code. According to embodiments, VSs 502 may not be transmitted (e.g., in a communication channel). According to embodiments, the bits of a VS 502 may be used (e.g., only) for generation of $r_c$ parity-check bits of a TS.

According to embodiments, a format of a codeword of the component code may define a code rate R of the QD-DTS-PrCC. According to embodiments, a length $N_{TS}$ of the TS and a code rate R of a QD-DTS-PrCC may be calculated according to Formulas 5A and 5B:

$$N_{TS} = \frac{n_c}{Q}; \quad \text{[Formula 5A]}$$

$$R = \frac{K}{N} = \frac{\left(\frac{n_c}{Q} - r_c\right)L_{cw}}{\left(\frac{n_c}{Q}\right)L_{cw}} = \quad \text{[Formula 5B]}$$

$$\frac{n_c - Qr_c}{n_c} = \frac{(Qn_c - Qr_c) - (Q-1)n_c}{n_c} = QR_c - Q + 1.$$

According to embodiments, a code rate of the component code $$R_c = \frac{n_c - r_c}{n_c}$$

may be (e.g., by definition) a positive number, and a code rate $R_c$ may satisfy a condition $$R_c > \frac{Q-1}{Q}.$$

According to embodiments, bits of TSs from m previously encoded EBBs (e.g., of TSs stored in the encoder's memory) may be mapped (e.g., used) by a mapper to fill (e.g., create) VSs of the codewords of the component code, for example, as shown in FIG. 5. That is, according to embodiments, each of the VSs of a codeword of a component code may be filled by (e.g., by mapping to the VSs) the bits of the TSs that are stored in the memory of the QD-DTS-PrCC encoder. According to embodiments, the TS and (Q−1) VSs of the codeword may each represent a (e.g., specific) dimension of a QD-DTS-PrCC.

According to embodiments, any of the features, operations, characteristics, methods, and elements of any of the encoder, decoder, and format of codewords of component codes, as disclosed herein, may be applied to and/or used for codes, such as any of continuously interleaved, staircase, and difference-triangle-set product convolutional codes. According to embodiments, however, QD-DTS-PrCCs are multidimensional in a case where Q>2, and QD-DTS-PrCCs may constitute a broad class of codes. That is, according to embodiments, such codes, e.g., the QD-DTS-PrCCs, may be (e.g., specifically) designed according to (e.g., organization of) their mapper and encoder's memory. According to embodiments, the difference between such codes may be defined (e.g., indicated) by the number of EBBs stored in the encoder's memory, and may further be defined by the mapper's rules that define which bit of which codeword, and of which previously encoded EBB stored in the encoder's memory, the bits should be selected from in creating the VSs of the codewords of a component code. According to embodiments, an organization of the mapper and the encoder's memory may define distance properties of any of the code, complexity, and latency of encoding.

According to embodiments, component code encoders may encode (e.g., by mapping) data intended for transmission to the EBBs of TSs, for example, as the output of the (e.g., overall) QD-DTS-PrCC encoder. According to embodiments, rules for bit-mapping (e.g. mapping, filling) may be used for generating VSs of component codewords. That is, according to embodiments, a QD-DTS-PrCC may encode an EBB (e.g., certain EBBs, each EBB, etc.) of a data stream according to rules. For example, in a case where each TS is generated by the encoder of the component code by encoding the $k_{TS}$ data bits and the $(Q-1)n_{TS}$ bits of the previously encoded TSs, which fill the VS of this code, such may be done using rules for bit-mapping (e.g., filling) for generating VSs of the component codewords. According to embodiments, rules for mapping (e.g., filling, creating, etc.) bits of the VSs of (e.g. each) codewords of the component codes may define the QD-DTS-PrCC (e.g., completely). That is, rules that describe how a mapper fills and/or creates VS bits of codewords of the component codes may (e.g., completely) define the QD-DTS-PrCC.

Figure 6A:
FIGS. 6A and 6B are diagrams illustrating bit control according to embodiments.
Figure 6A:
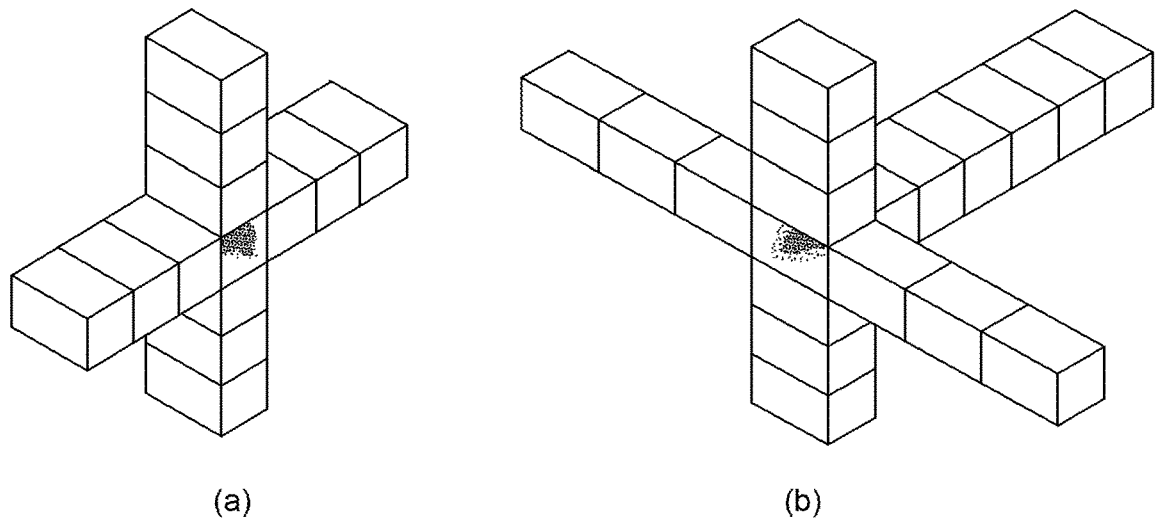

According to embodiments, the bit-mapping rules may be as discussed (e.g., as defined, as described, as provided, etc.) below. According to embodiments, a QD-DTS-PrCC may be defined by (e.g., formulating requirements for) the bit-mapping of the VSs. According to embodiments, a QD-DTS-PrCC may be built (e.g., constructed, designed, configured, etc.) such that each bit of the QD-DTS PRCC is protected by Q codewords of the component code, for example, as shown in FIG. 6A. According to embodiments, in view of the bit control by Q-dimensional product codes shown in FIGS. 6A and 6B, orthogonality between the codewords of a component code controlling each bit may (e.g., should) be provided. According to embodiments, such orthogonality may be a (e.g., natural) property of canonical block product codes, where the orthogonality directly follows from geometrical construction of such codes. In a case of convolutional codes, some design rules may (e.g., should) be provided to provide (e.g., guarantee) such orthogonality.

Figure 6B:
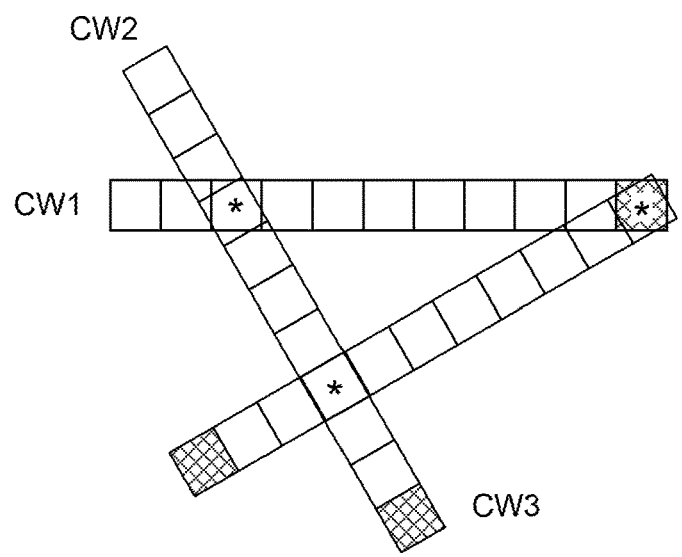
Figure 6B:

According to embodiments, rules (e.g., a complete set of rules) for designing a QD-DTS-PrCC may be as given in Table 1. According to embodiments, as shown in FIG. 6A, each bit may be controlled by Q-orthogonal codewords, which may be any of a two-dimensional code and a three-dimensional code. According to embodiments, as shown in FIG. 6B, bit control may occur using an improper designed three-dimensional code. According to embodiments, each marked bit may be controlled by Q nonorthogonal codewords, such as the component single parity-check code of length $n_c=10$ and $d_c=2$, for example, as shown in FIG. 6B. According to embodiments, such concatenation may result in a code with $d_{min}=3$ (e.g., only).

According to embodiments, rules defining a QD-DTS-PrCC may be as shown in Table 1.

TABLE 1

| # | Rule |
|---|---|
| 1 | Bits of the TSs of a given layer should not be used to fill the VSs in the same layer. |
| 2 | All bits of VSs of the same dimension in given layer should be filled by bits of TSs, which belong to one layer. |
| 3 | A given bit in a given layer and given segment is used to fill one and only one bit position in only one VS in layer 0 (e.g. transmit layer). |
| 4 | Each bit of an arbitrary TS in a given layer should fill only (Q − 1) VSs of different component codewords in the other (Q − 1) layers. |
| 5 | Indexing of the encoded layers of TSs stored in the memory of the QD-DTS-PrCC encoder should be defined by Q-DTS. |
| 6 | Two codewords of Q-codeword set from different layers have to control one and only one bit of one and only one codeword from another layer. |

According to embodiments, the above discussed (e.g., proposed, new, unconventional, etc.) class of convolutional codes may be referred to as a QD-DTS-PrCC, for example, because of indexing Q-layers of TSs involved in control in accordance with the Q-difference triangle set (DTS). According to embodiments, as a (e.g., each) EBB (e.g., layer) may consist of $L_{cw}$ TSs and $L_{cw}=n_{TS}$, a minimal number of previously encoded EBBs, $L_{l,min}=(Q-1)$, may (e.g., should) be used to fill the VSs of the currently encoded layer.

According to embodiments, $L_{l,min}$ may be determined according to (e.g., by following, from, etc.) rules. According to embodiments, $L_{l,min}$ may be determined according to the above described rules, for example, that each bit of the $(Q-1)$ VSs of the codewords of component codes may be filled by (e.g., only) one bit of the previous TSs belonging to one layer, and that there cannot be more than one bit in VSs of the codeword which is filled by a corresponding TS. According to embodiments, for example, in a case when $L_{cw}=n_{TS}$, the rules 1-4 shown in Table 1 may guarantee that each bit of any TS of the QD-DTS-PrCC may be (e.g., precisely) protected by Q codewords of the component codes representing Q dimensions of the QD-DTS-PrCC. That is, according to embodiments, each bit may be protected one time as a bit of the component code with this TS (first dimension), and $(Q-1)$ times as bits of VSs of component codes of the rest of the $(Q-1)$ EBBs.

Figure 7:
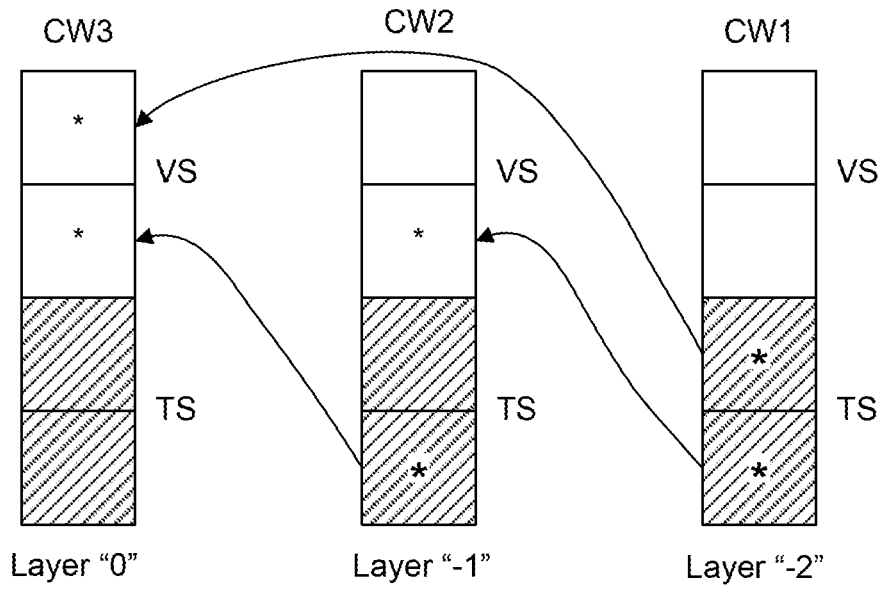
FIG. 7 is a diagram illustrating codewords according to embodiments.

FIG. 7 is a diagram illustrating codewords according to embodiments.

Referring to FIG. 7, an example of codewords of the product-like convolutional code is shown, wherein a component single parity-check code may be of length $n_c=4$ and $d_c=2$ and a number of EBBs of TSs stored in an encoder memory may be $L_{l,min}=2$. According to embodiments, for example, in the case of FIG. 7, such concatenation may result in a convolutional code with $d_{min}=3$ only. According to embodiments, in a case where rules 1-4 are satisfied, such may result in (e.g., produce) a convolutional code with a smaller minimal distance than that of a true product convolutional code. For example, such an improperly designed code is shown in FIG. 7, which may represent the case shown in FIG. 6B, wherein FIG. 7 shows the ordering in EBB codewords.

According to embodiments, in view of FIGS. 6B and 7, orthogonality for the canonical product code may be (e.g., considered) equivalent to a general property of Q-dimensional codes, for example, in a case wherein: (1) the Q-codewords-set controls the same bit; and (2) other bits of all these codewords are controlled by (e.g., only) one codeword of this Q-codewords-set. According to embodiments, rules 5 and 6 from Table 1 may be (e.g., considered as) restrictions on the code design, for example, to provide (e.g., guarantee) the orthogonality of codewords of component codes. For example, rule 5 may be considered a restriction on EBB-indexing and rule 6 may be considered as a restriction on a choice of codewords indexing for given layers.

According to embodiments, a VS may be generated according to differences between EBB indexes. For example, in order to provide orthogonality of EBBs of a Q-dimensional product convolutional code, the differences of the EBB indexes of TSs (e.g., stored in an encoder memory) may be used for selecting the EBBs used for generating (e.g., filling) a VS of a currently encoded EBB. Referring to FIGS. 6B and 7, there may be a case where the differences between EBB indexes {0, −1, −2} of the code are:

$d_{0,1}=(0-(-1))=1,$ $d_{0,2}=(0-(-2))=2,$ $d_{1,2}=((-1)-(-2))=1.$

In such a case, the differences $d_{0,1}$ and $d_{1,2}$ for this code are equal, or in other words, $d_{0,1}=d_{7452}=1$. According to embodiments, in the case of FIG. 7: (1) a TS of a CW1 may be used in generation of VSs in CW2 and CW3, and (2) a TS of CW2 may be used in generation of a VS in CW3. That is, CW1 fills the VS of CW2, whereas CW2 and CW1 simultaneously fill the VS of CW3.

Figure 8:
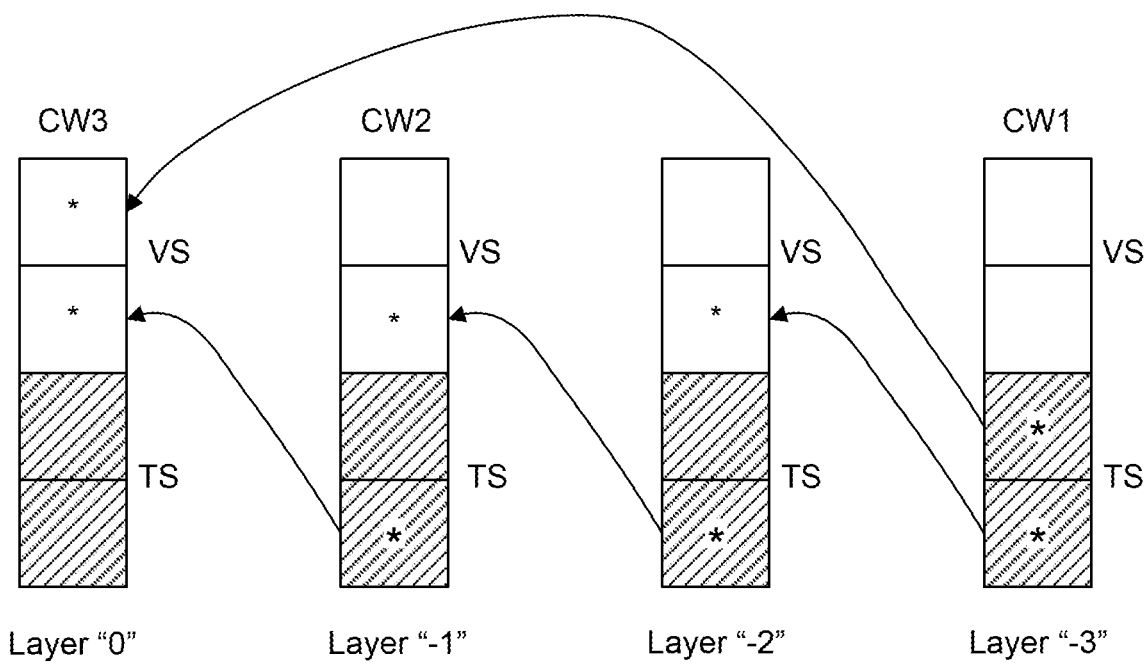
FIG. 8 is a diagram illustrating a method of encoding a QD-DTS-PrCC according to embodiments.

FIG. 8 is a diagram illustrating a method of encoding a QD-DTS-PrCC according to embodiments.

According to embodiments, for example, referring to FIG. 8, the differences between indexes of EBBs may be distinct integers (e.g., integers having different and/or respective values). For example, referring to FIG. 8, the differences between indexes {0, −1, −3} of EBBs of the TSs which are used to generate the VS of the currently encoded EBB are distinct integers:

$d_{0,1}=(0-(-1))=1,$ $d_{0,3}=(0-(-3))=3,$ $d_{1,3}=((-1)-(-3))=2.$

In such a case, bits of TS segments of CW1 and CW2 may be used (e.g., jointly) to generate (e.g., fill, simultaneously) VSs of CW3. However, CW1 may not be used to generate a VS of CW2, for example, because differences between these g indexes may be distinct integers. According to embodiments, EBBs having distinct (e.g., respective) differences in their EBB indexes may result in (e.g., may be used to generate) a convolutional code with $d_{min}=4$. According to embodiments, there may be (e.g., a required number of) three EBBs in the encoder memory. For example, referring to FIG. 8, an encoder memory may (e.g., be required to) have three EBBs, which is larger than $L_{l,min}=2$.

According to embodiments, the $L_{l,min}$ EBBs that are used in composing (e.g., filling) the VSs of the currently encoded EBB may (e.g., should) have (e.g., distinct) differences between their indexes. According to embodiments, having distinct differences between indexes may (e.g., help) avoid a choice of the EBB indexing corrupting orthogonality of codewords of component codes. According to embodiments, indexing of the $L_{l,min}$ layers filling the VSs of the currently encoded layer may be used, for example, based on difference triangle sets for example, to fulfill an orthogonality requirement.

According to embodiments, a Q-difference triangle set (Q-DTS) may be a set of integers $\{a_j|0 \leq Q\}$ such that all differences $\{a_j - a_{j'}|0 \leq j' \leq j\}$ with $0 = a_1 < a_2 < \ldots < a_{J-1}$ are distinct. According to embodiments, difference triangle sets may be used in FEC design, and a Q-DTS may also be referred to as a Golomb ruler. According to embodiments, (e.g., some) Q-DTSs are shown in Table 2A, wherein m is and/or represents a maximal integer of a (e.g., particular) Q-DTS. According to embodiments, a maximal integer m of Q DTS may define a number of EBBs of TSs stored in a QD-DTS-PrCC encoder memory and may coincide with a maximal degree of generator polynomials of the QD-DTS-PrCC. The present disclosure is not limited to the various sets shown in Tables 2A and 2B, and any suitable and/or similar difference triangle set (DTS) may be used according to embodiments. Another group of useful DTSs is given in Table 2B. These DTSs were designed for decreasing an influence of intermodulation interference. Such Q-DTS $\{0 \leq a_0 < a_1 < \ldots < a_{Q-1}\}$ are built with a feature (e.g., requirement) that all 3-term sums $\Sigma_{t=1}^{3} a_{i_t}$ are distinct. The DTSs of Table 2B may be longer than those Table 2A, which may result in an increase of the constraint length of the code and overall encoding latency. However, such Q-DTSs show (e.g., somewhat) better performance with iterative decoding of the QD-DTS-PrCCs.

TABLE 2A

| Q | Q-DTS | m |
|---|---|---|
| 2 | {0, 1} | 1 |
| 3 | {0, 1, 3} | 3 |
| 3 | {0, 1, 4} | 4 |
| 3 | {0, 1, 8} | 8 |
| 4 | {0, 1, 4, 6} | 6 |
| 5 | {0, 1, 4, 9, 11} | 11 |

TABLE 2B

| Q | Q-DTS | m |
|---|---|---|
| 2 | {0, 1} | 1 |
| 3 | {0, 1, 4} | 4 |
| 4 | {0, 1, 8, 11} | 11 |
| 5 | {0, 1, 7, 16, 27} | 27 |
| 6 | {0, 14, 18, 45, 51, 56} | 56 |

Figure 9:
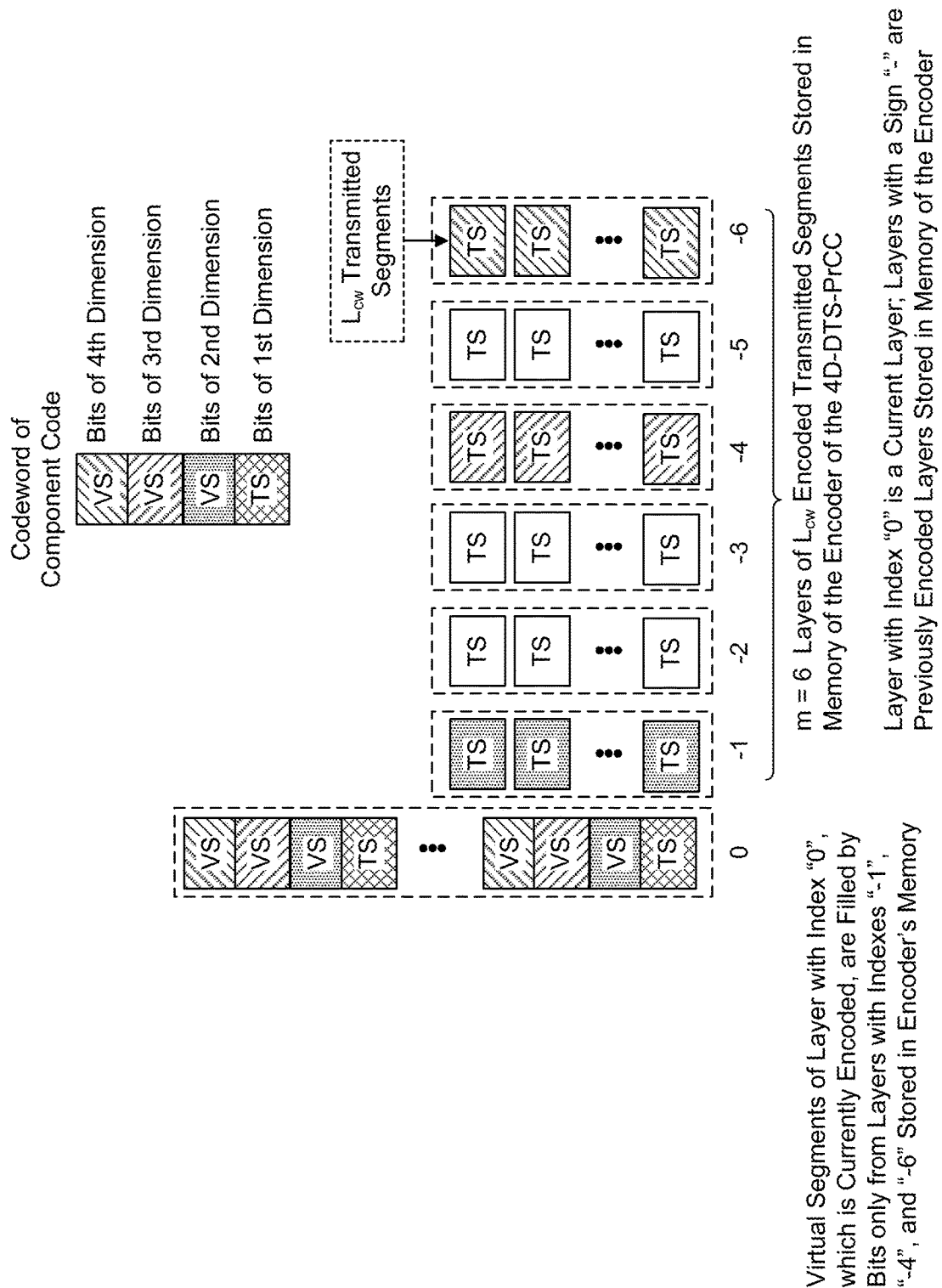
FIG. 9 is a diagram illustrating indexing of a QD-DTS-PrCC according to embodiments.

FIG. 9 is a diagram illustrating indexing of a QD-DTS-PrCC according to embodiments.

Referring to FIG. 9, EBB indexing of a QD-DTS-PrCC may be for a DTS of four integer values, that is, the QD-DTS-PrCC may be defined by a Q-DTS having a Q=4, which may be expressed as a 4-DTS of {0, 1, 4, 6}. According to embodiments, FIG. 9 illustrates a QD-DTS-PrCC encoder having 6 EBBs stored in the memory, or in other words, the number m=6 is for the number of EBBs stored in the memory. According to embodiments, a 4-DTS of {0, 1, 4, 6} may be used indexing $L_{l,min}=Q=4$ EBBs of the TSs used for filling (e.g., that are mapped to) the VSs of the currently encoded EBB. According to embodiments, the sign "−" (e.g., a negative, or minus, sign) may denote previously encoded EBBs stored in the QD-DTS-PrCC encoder's memory, for example, relative to a current EBB having an index of 0, for example, an EBB with a given index "layer$_{pos}$–0". According to embodiments, (e.g., only) bits of the TSs of the previously encoded EBBs stored in the QD-DTS-PrCC memory having indexes "layer$_{pos}$–1", "layer$_{pos}$–4" "layer$_{pos}$–6" may be used for encoding of the TSs of the EBB having index "layer$_{pos}$–0". According to embodiments, VSs of different dimensions of a given codeword may be filled by bits of (e.g. only) the specific different dimensions.

According to embodiments, using a DTS for indexing layers (e.g., EBBs) may be a necessary and sufficient condition for orthogonality of codewords of DTS-PrCCs and 2D-DTS-PrCCs (wherein 2D-DTS-PrCCs may be considered a special case of DTS-PrCCs). According to embodiments, in a case of higher dimensionality, for example, Q≥3, the use of a Q-DTS may be a necessary condition, but not a sufficient condition, of orthogonality. According to embodiments, rule 6 of Table 1 may result in fulfilment of the requirement that two codewords of a Q-codeword set control one (e.g., and only one) bit of one (e.g., and only one) codeword from another EBB. According to embodiments, (e.g., even) in a case where EBBs are orthogonal, for example, due to use of the Q-DTS, a proper codeword (e.g., satisfying rule 6) may (e.g., should) be chosen for indexing in each layer of TSs stored in the memory of the encoder.

According to embodiments, any of: (1) an EBB's position (e.g., index) relative to other EBBs saved in the memory, (2) a component codeword number in the layer, and (3) a bit index in the codeword of the layer, may be used for the description of the encoding and decoding of each bit of the QD-DTS-PrCCs. According to embodiments, such a description may be sufficient for an (e.g., exact) representation of each bit at any of the input and the output of the encoder of the QD-DTS-PrCC and may be sufficient for an (e.g., exact) representation of their relations (e.g., relationships), for example, as defined by the memory of the encoder.

According to embodiments, and as described herein, each bit location may be given in a form of any number of coordinates defining a position (e.g., an exact position) of a corresponding bit of an arbitrary component codeword of a particular EBB. According to embodiments, a coordinate may have (e.g., may be provided, identified, described, etc., according to) a format of: EBB (e.g., layer) position, codeword position, bit-position. According to embodiments, a coordinate (layer$_{pos}$, cw$_{pos}$, bit$_{pos}$), which may be referred to as a triple coordinate, of each bit in the VSs of a currently encoded EBB may be defined by any of the following indexes: (1) layer$_{pos}$: index of a currently encoded EBB; (2) cw$_{pos}$: index of the currently encoded component codeword (e.g. codeword of component code) in EBB layer$_{pos}$ (e.g., an EBB having index layer$_{pos}$), and (3) bit$_{pos}$: index of the bit (n$_{TS}$≤bit$_{pos}$<n$_c$) within the VSs of the currently encoded component codeword cw$_{pos}$, in EBB layer$_{pos}$.

According to embodiments, a triple coordinate (layer$_{pos}$, cw$_{pos}$, bit$_{pos}$) may be used to identify (e.g., calculate) the triple coordinate (layer'$_{pos}$, cw'$_{pos}$, bit'$_{pos}$) of a bit in a TS of an encoded EBB that is (e.g., already) stored in the QD-DTS-PrCC encoder memory. According to embodiments, the identified bit may be used to fill (e.g., may be mapped to) the bit-position of one of (Q−1) VSs of the VS of the codeword having index cw$_{pos}$. According to embodiments, a variant of universal bit-mapping for the VSs of the component codewords of the QD-DTS-PrCC having an odd number of codewords in the EBB, which is built in accordance with the requirements formulated in Table 1 and the foregoing "coordinate" notation, is shown in Table 3 where an operator "/" may denote a floor division, for example, 3/2=1; and operator "x % y" may denote a remainder, for example, 5% 3=2. According to embodiments, this bit-mapping may follow an EBB indexing and bit-numbering of a component codeword, for example as shown in FIGS. 4 and 5. According to embodiments, Table 3 shows a variant of universal VS bit-mapping for the 3D-DTS-PrCCs with component (n$_c$, k$_c$) systematic block codes and an odd number of codewords in an EBB.

TABLE 3

| Parameters of encoder of the 3D-DTS-PrCC | VSs bit-mapping of the component codeword |
|---|---|
| Q = 3 dimensions, (n$_c$, k$_c$) component code, | //Mapper returns an address (layer'$_{pos}$, cw'$_{pos}$, bit'$_{pos}$) of bit of TS //stored in memory based on given (bit$_{pos}$, cw$_{pos}$, layer$_{pos}$) |
| L$_{cw}$ codewords in a layer, | dim = ⌊bit$_{pos}$/n$_{TS}$⌋; //index of dimension of this bit |
| n$_{TS}$ = n$_c$/3 is an odd number | bit'$_{pos}$ = bit$_{pos}$ − dim · n$_{TS}$; if (dim == 1) cw' = (cw$_{pos}$ + bit$_{pos}$)% L$_{cw}$; |
| bit$_{pos}$ ≥ n$_{TS}$, | else cw' = (cw$_{pos}$ + L$_{cw}$ − 1 − bit$_{pos}$)% L$_{cw}$; |
| L$_{cw}$ = n$_{TS}$ | layer'$_{pos}$ = layer$_{pos}$ − dts[dim]; |
| Array of 3-DTS: dts[ ] = {0, a$_1$, a$_2$} | |

According to embodiments, any of hardware and/or software implementations, operations, methods, features, etc., of QD-DTS-PrCC encoding and/or decoding may be based on the bit-mapping described in Table 3. According to embodiments, the variants for indexes bit$_{pos}$'$_{pos}$ and cw'$_{pos}$ defined by the Q-DTS may be non-unique. For example, the variants for indexes bit'$_{pos}$ and cw'$_{pos}$ may be non-unique, even in the case of being built according to the requirements given in Table 1. According to embodiments, there may be flexibility for choosing (e.g., selecting) the indexes bit'$_{pos}$ and cw'$_{pos}$. According to embodiments, the variants shown in Table 3 may be chosen (e.g., selected) for use with an arbitrary number of codewords L$_{cw}$ of component codes in an EBB, for example, because of and/or according to their universality.

A constraint length of a QD-DTS-PrCC may be referred to as N$_A$, and may be a (e.g., useful) parameter for comparison of convolutional codes. According to embodiments, a constraint length N$_A$ may be determined according to Formula 7:

$$N_A = N(m+1) = \left(\frac{n_c}{Q}L_{cw}\right)(m+1), \quad \text{[Formula 7]}$$

wherein m stands for a maximal degree of generator polynomials of the QD-DTS-PrCC. According to embodiments, for example, referring to FIG. 9, a maximal degree m of generator polynomials of a QD-DTS-PrCC may coincide with a maximal integer m of a Q-DTS that may define the QD-DTS-PrCC. An upper bound for the maximal degree of generator polynomials m of the QD-DTS-PrCCs may coincide with an (e.g., other) upper bound. According to embodiments, the upper bound for the maximal degree of generator polynomials m of the QD-DTS-PrCCs may coincide with the upper bound for the maximal integer of the Q-DTS defining a QD-DTS-PRCC, as shown in Formula 8:

$$m \geq \frac{Q(Q-1)}{2}.$$ [Formula 8]

According to embodiments, in a case where a Q-DTS specifying the QD-DTS-PrCC has the smallest maximal integer m among all the DTSs with Q elements, then a QD-DTS-PrCC defined by the Q-DTS may have a smallest $N_A$. According to embodiments, as discussed herein, (e.g., all) parameters of a QD-DTS-PrCC may be used (e.g., necessary, and/or sufficient) for implementing any of an encoder and a decoder of the QD-DTS-PrCC are determined and/or discussed herein.

A design of a QD-DTS-PrCC is described below according to embodiments. That is, according to embodiments, there may be a three-dimensional (3D) DTS-PrCC with a component (255, 237) systematic double extended binary BCH code (e.g., each code may be represented by (n,k) where n may be size of an encoded bit stream and k may be a size of an input bit stream) having a $d_{min}$=6. According to embodiments, length of a TS may be determined as $$N_{TS} = \frac{255}{3} = 85.$$

According to embodiments, a $L_{cw}$ may be selected such that $L_{cw}$=$N_{TS}$=85 TSs in the EBB of the 3D-DTS-PrCC. According to embodiments, Formula 2 (see above) provides a code rate of this 3D-DTS-PrCC as:

$$R = \frac{K}{N} = \frac{\left(\frac{n_c}{Q} - r_c\right)L_{cw}}{\left(\frac{n_c}{Q}\right)L_{cw}} = \frac{n_c - Qr_c}{n_c} = \frac{255 - 3(255 - 237)}{255} = 0.788$$

According to embodiments, in the case of the design of the 3D-DTS-PrCC described above, a 3D-DTS {0, 1, 4} may be chosen (e.g., selected) from the Q-DTSs shown in Table 4 as the Q-DTS defining the 3D-DTS-PrCC. According to embodiments, VS bit-mapping of a designed code may be done as shown in Table 4, for example, to be implemented in accordance with the variant given in Table 4. According to embodiments, VS bit-mapping of the 3D-DTS-PrCC with a component (255,237) systematic block code is shown in Table 4.

According to embodiments, a QD-DTS-PrCC designed as described above may have a constraint length given as:

$$N_A = N(m+1) = \left(\frac{n_c}{Q}L_{cw}\right)(m+1) = \frac{355}{3}85(4+1) = 36,125.$$

Decoder Structure

According to embodiments, a QD-DTS-PrCC may be a convolutional code, and may allow for (e.g., admit, be applied to, etc.) a range (e.g., a variety) of decoding strategies having varying complexities and latencies. Product-convolutional codes (e.g., all known product-convolutional codes) may use iterative decoding. In the case of high-throughput systems (e.g., a throughput 400 Gb/s), iterative decoding with hard decision syndrome decoding of component codes may be used for staircase codes, continuously-interleaved, and braided codes. In the case of iterative soft-decision decoding of product-convolutional codes, known methods of decoding parallel-concatenated codes may be applied.

According to embodiments, in the case of decoding a QD-DTS-PrCC, an iterative decoding algorithm may be used. According to embodiments, a QD-DTS-PrCC may be decoded iteratively over a window of L received EBBs (e.g., a received EBB may correspond to a transmitted EBB including any of channel noise and interference), for example, in a manner similar to staircase codes. According to embodiments, there may be a case having a decoding window of L=10 received EBBs and a QD-DTS-PrCC EBB received from channel at time i may be denoted as $Y_{TS,i}$. According to embodiments, at a (e.g., very) beginning of decoding, $Y_{TS,i}$, i=0, 1, . . . , (m−1), which may also be known as all-zeros EBBs, wherein m denotes the maximal integer of the DTS defining the QD-DTS-PrCC, and $\{Y_{TS,m}, \ldots, Y_{TS,10}\}$ are the first (10−(m−1)) received EBBs from the channel. According to embodiments, in the decoding window, for each i∈{m, . . . , 10}, a decoder may reconstruct codewords of component codes using decoded bits of the consecutively received EBBs ($Y_{TS,i}$, $Y_{TS,i+1}$, . . . , $Y_{TS,i+m}$), for example, according to the word format shown in FIG. 5 and a bit-mapping satisfying rules, for example, as provided in Table 1.

According to embodiments, at each decoding iteration, a decoder may proceed from i=m by decoding each component code used in constructing EBB i, for example, using a hard decision decoder suitable for the component code. According to embodiment, corrections (e.g., updates) may be made to received EBBs $Y_{TS,0}$–$Y_{TS,DTS[u]}$, u=0, 1, . . . , (Q−1), wherein DTS[u] may be an array of indexes of layers

TABLE 4

| Parameters of encoder of the 3D-DTS-PrCC | VSs bit-mapping of the component codeword |
|---|---|
| Q = 3 - dimensional code, $(n_c, k_c)$ = (255, 237) component code, | //Mapper returns address (layer$_{pos}$', cw$_{pos}$', bit$_{pos}$') of bit of //TS stored in memory based on bit$_{pos}$, cw$_{pos}$, layer$_{pos}$) |
| $n_{TS} = \frac{n_c}{Q} = 85$, bit$_{pos}$ ≥ 85 | dim = ⌊bit$_{pos}$/n$_{TS}$⌋; //index of dimension of the bit |
| $L_{cw}$ = $n_{TS}$ codewords in a layer, Array of 3-DTS: dts[ ] = {0, 1, 4} | bit$_{pos}$' = bit$_{pos}$ − dim · 85; if (dim == 1) cw' = (cw + bit$_{pos}$)% 85; else cw' = (cw + L$_{cw}$ − 1 − bit$_{pos}$)% 85; layer$_{pos}$' = layer$_{pos}$ − dts[dim]; | involved in control of these bites. For example, corrections and/or updates may be made because every bit may be involved in (e.g., used for) Q component codewords. According to embodiments, the (e.g., corresponding) corrections and/or updates may be performed in the manner (e.g., for all) $Y_{TS,0}-Y_{TS,DTS[u]}$. According to embodiments, reconstruction and decoding of component codewords may continue (e.g., proceed) EBB-by-EBB (e.g., from one EBB to the next EBB) until the end of the window is reached at i=10. According to embodiments, at the end of decoding iterations, the decoding window may output the $Y_{TS,m}$ EBB and may take an input of a (e.g., newest) received block Y According to embodiments, the decoding process may continue indefinitely as the decoding window slides across each newly received EBB.

According to embodiments, it may be beneficial to repeat the above-described (e.g., foregoing) process of decoding, and it may be useful to use a modified decoding. According to embodiments, such repeated and/or modified decoding may result in a performance improvement due to an error-propagation decrease, for example, caused by the following miscorrections: (1) only t–1 errors are corrected for a t-error correcting component code of the most unreliable layer (e.g., the most unreliable layer are the layers received from the channel); and (2) the reliability of the following layers is increased.

Performance Results

Figure 11:
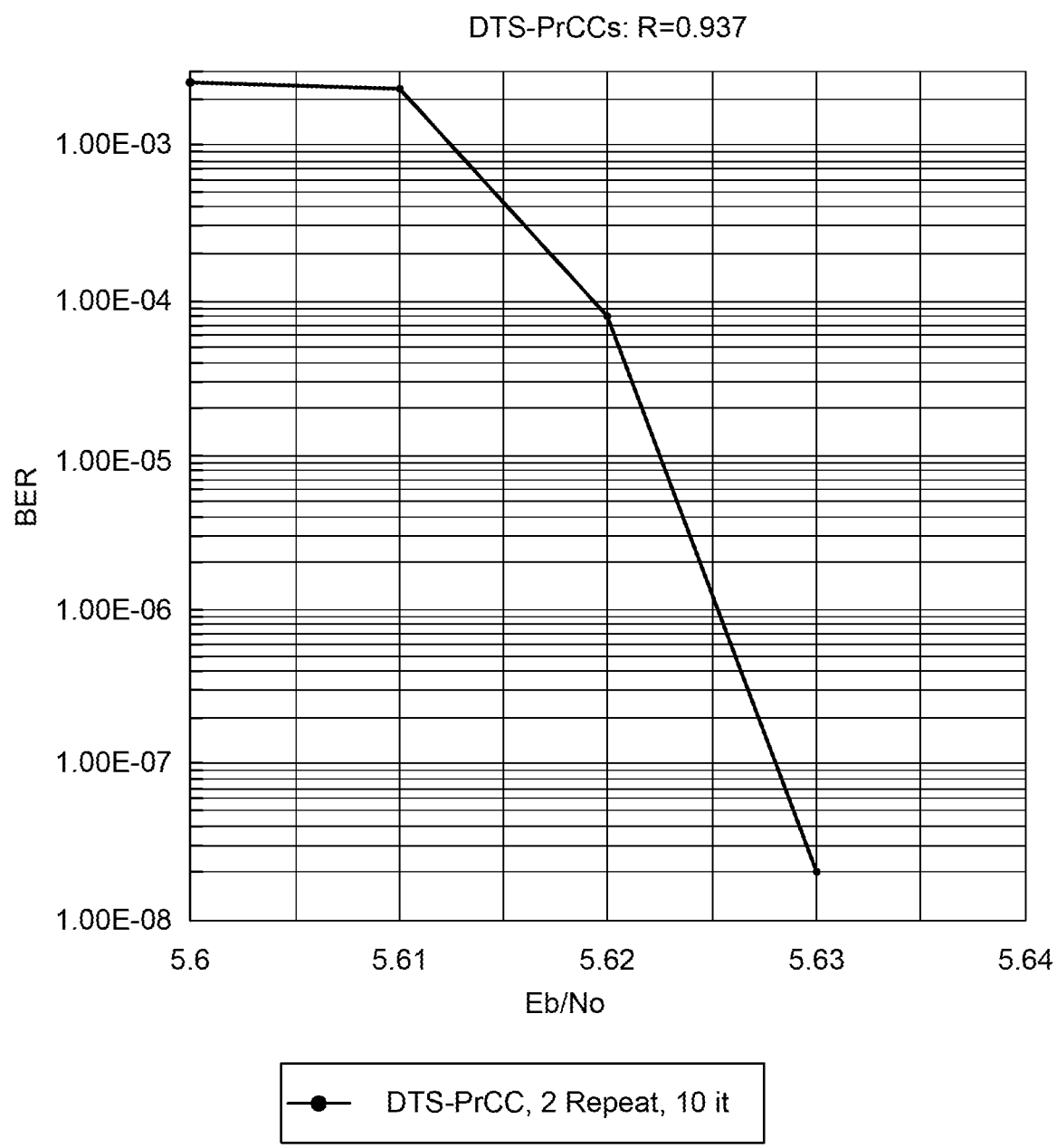

FIGS. 10 and 11 are diagrams illustrating simulation results of bit error rate (BER) performance of the 3D-DTS-PrCCs according to embodiments. Referring to FIG. 10, performance of the 3D-DTS-PrCCs with a rate R=0.935 and component (1023, 1001) BCH codes with $d_{min}$=6 (t=2) is shown. Referring to FIG. 11, performance of the two-dimensional DTS-PrCCs with a rate R=0.937 and component (1020, 990) BCH codes with $d_{min}$=8 (t=3) is shown.

According to embodiments, a double extended ($n_c$, $k_c$) binary BCH code may be a component code of the 3D-DTS-PrCCs under consideration. According to embodiments, double extended ($n_c$, $k_c$) binary BCH codes with non-extended parameters $n_{bch}=2^{m_{bch}}-1$, $n_{bch}=2^{m_{bch}}-tm_{bch}$ may be used as component codes, wherein $m_{bch}$ may be a field extension degree and t may stand for a number of correctable errors. According to embodiments, parameters of the double extended codes are shown in Table 5, wherein $$n_{TS} = \frac{n_c}{3}$$

and an overload $$OH = \frac{r_c}{n_{TS} - r_c}.$$

TABLE 5

| Code rate R | Overhead OH | $m_{BCH}$ | t | $n_{TS} = \frac{n_c}{3}$ | ($n_c$, $k_c$) | 3-DTS |
|---|---|---|---|---|---|---|
| 0.935 | 6.89 | 10 | 2 | 341 | (1023, 1001) | {0, 1, 4} |

According to embodiments, a mapper of a 3D-DTS-PrCC may be built according to rules, such as, for example, in accordance Table 5. According to embodiments, a channel model with additive white Gaussian noise (AWGN) and binary phase shift keying (BPSK) modulation may be assumed, and all BER performance curves may be simulated according to a condition that a number of decoding errors is not smaller than 100. According to embodiments, an output BER at 5.58 dB given in FIG. 10 is based on 36 output errors.

According to embodiments, FIG. 10 illustrates a rate R=0.935 for 3D-DTS-PrCCs with component $d_{min}$=6 (t=2) (1023, 1001) BCH codes. According to embodiments, in view of comparing FIG. 10 and simulation results of staircase codes, a 3D-DTS-PrCC defined by DTS: {0,1,4} may provide approximately (e.g., nearly, almost) the same performance as that of the staircase codes of a similar (e.g., the same) rate with a (e.g., much) more complex decoder of component BCH codes with t=4 and a (e.g., much) bigger number of encoders/decoders in one EBB. According to embodiments, in view of FIGS. 10 and 11, it may be seen that the 3DTS-PrCC provides (e.g., somewhat) better performance than that of more complex DTS-PrCC with component codes having t=3.

Comparison of QD-DTS-PrCCs with Product, Staircase, and LDPC Codes

Hereinbelow, QD-DTS-PrCCs (e.g., a QD-DTS-PrCC as described above and/or according to embodiments herein) may be compared with product codes (e.g., product block codes), staircase codes, and LDPC codes, for example, wherein binary component codes have the same $n_c$ and $k_c$. In a case of comparing a QD-DTS-PrCCs (e.g., a QD-DTS-PrCC as described above according to embodiments) with a product block code (e.g., a canonical, multidimensional, conventional, etc. product block code), a length $N_{pc}$ of a Q-dimensional product code may be determined according to Formula 10:

$$N_{pc} = n_c^Q \qquad \text{[Formula 10]},$$

wherein, a number of information bits $K_{pc} = k_c^Q = (n_c - r_c)^Q$. Further, in such a case, a code rate $R_{pc}$ of a Q-dimensional product code may be determined according to Formula 11:

$$R_{pc} = \frac{K_{pc}}{N_{pc}} = \frac{k_c^Q}{n_c^Q} = \frac{(n_c - r_c)^Q}{n_c^Q} \geq 1 - \frac{Qr_c}{n_c}. \qquad \text{[Formula 11]}$$

According to embodiments, such lower bound may follow from Bernoulli's inequality on numbers of the form $(1-x)^Q$: $(1-x)^Q \geq 1-Qx$ for integer $Q \geq 0$ and real number $0 < x < 1$.

Comparing the code rate of a QD-DTS-PrCC, which may be represented as $$R = \frac{K}{N} = \frac{(n_c - Qr_c)}{n_c} = 1 - \frac{Qr_c}{n_c},$$

and the code rate $R_{pc}$ of a two-dimensional product code, it is apparent that a code rate of the product code may be (e.g., slightly) larger than a code rate of the QD-DTS-PrCC. In a case of (e.g., typical) code rates higher than R>0.8 (e.g., which may be code rates of interest for ultra-high speed systems), along with (e.g., typical) component codes of length $n_c$=200-2000, the difference (e.g., in code rates) may be negligible.

According to embodiments, a constraint length $N_A$ of the QD-DTS-PrCC with a $$L_{cw} = \frac{n_c}{Q}$$

may be determined according to Formula 12:

$$N_A = N(m+1) = \left(\frac{n_c}{Q} L_{cw}\right)(m+1) = \left(\frac{n_c}{Q}\right)^2 (m+1).$$ [Formula 12]

Comparing a constraint length $N_A$ of the QD-DTS-PrCC with a length $N_{pc}$ of a Q-dimensional product code, it is apparent that the QD-DTS-PrCC has a constraint length that is (e.g., much) smaller than (e.g., half the size of) the length of the Q-dimensional product codes having (e.g., approximately) the same code rate, for example, as shown in Formula 13:

$$\frac{N_{pc}}{N_a} = \frac{n_c^Q}{\left(\frac{n_c}{Q}\right)^2 (m+1)} = \frac{Q^2}{m+1} n_c^{Q-2}.$$ [Formula 13]

According to embodiments, there may be a case where a number of component codes of the 3D-DTGS-PRCC is given (e.g., chosen) as $$L_{cw} = \frac{n_c}{Q} = \frac{n_c}{Q},$$

and a DTS is a 3-DTS {0,1,3}, for example, that defines a maximal degree of the generator polynomials m=3 of the 3D-DTS-PrCC. In such a case, according to embodiments, a constraint length of the 3D-DTS-PrCC may be as shown in Formula 14:

$$N_A = \left(\frac{n_c}{3}\right)^2 (m+1) = \frac{4}{9} n_c^2.$$ [Formula 14]

In such a case, comparing a constraint length of the 3D-DTS-PrCC to a length of a Q-dimensional product code produces the relationship $$\frac{N_{pc}}{N_a} = \frac{9}{4} n_c.$$

In such a case, comparing the length of the product codes with the same component codes as the QD-DTS-PrCC, the QD-DTS-PrCC may have a constraint length that is $n_c$ times smaller than that of the product codes. According to embodiments, Table 6 may provide numeric comparisons for the case of component double extended component BCH codes.

According to embodiments, as shown in Table 6, even in a case of three-dimensional codes, 3D-DTS-PrCCs may have constraint lengths that are (e.g., approximately, more than, etc.) 1000 times shorter than lengths of canonical 3D-product codes. In such a case, a ratio $$\frac{N_{pc}}{N_a} = \frac{Q^2}{m+1} n_c^{Q-2}$$

may reflect that length of multi-dimensional product codes may be exponentially bigger than $N_A$ of a QD-DTS-PrCC (e.g., the proposed class of codes).

TABLE 6

| | 3D canonical product code | | Constraint | 3D-DTS-PCC (defined by 3-DTS {0, 1, 3}) | |
|---|---|---|---|---|---|
| $(n_c, k_c, d_c)$ | Length $N_{pc}$ | $R_p$ | length $N_A$ | R | $N_{pc}/N_A$ |
| (510, 490, 6) | 132651000 | 0.887 | 115600 | 0.882 | 1147 |
| (1023, 1001, 6) | 1070599167 | 0.937 | 465124 | 0.935 | 2301 |

From the above, it is apparent (e.g., obvious) that multi-dimensional canonical product codes are not practical, for example, due to their (e.g., unrealistic, huge, etc.) code length. Such large code lengths may be a reason for not using multidimensional canonical product codes (e.g., except for low-rate variants based on very short component codes or single parity check codes) in telecommunication systems.

In a case of comparing a QD-DTS-PrCCs with a staircase code, the staircase code may be (e.g., considered as) a special case of DTS-PrCCs defined by the 2-DTS {0, 1}. As noted above, a BER performance of: (a) 3D-DTS-PrCCs with component BCH code with t=2 and (b) staircase codes with much more powerful component codes with t=4, is almost the same in the simulated BER range. As such, in comparing a QD-DTS-PrCC with a staircase code, there are advantages of the QD-DTS-PrCC providing any of smaller decoding complexity and smaller encoding complexity.

Table 7 provides a comparison of a staircase code with a 3D-DTS-PrCC in the case of iterative decoding (e.g., as described above).

TABLE 7

| Parameter | Staircase code | 3D-DTS-PrCC (defined by 3-DTS {0, 1, 4} |
|---|---|---|
| Overhead $\left(\frac{N-K}{K}\right)$ | 6.25 | 6.89 |
| A code rate R = K/N | 0.941 | 0.935 |
| Component code $(n_c, k_c)$ | (1496, 1462) | (1023, 1001) |

TABLE 7-continued

| Parameter | Staircase code | 3D-DTS-PrCC (defined by 3-DTS {0, 1, 4} |
|---|---|---|
| Number of correctable errors by component decoder t | 4 | 2 |
| Length of the transmitted segment $n_{TS}$ | 748 | 341 |
| Maximal degree of generator polynomials m | 1 | 4 |
| Constraint length of the code $N_A$ | 1,119,008 | 581,405 |
| Number of syndrome formers | 748 | 341 |
| Number of encoders of component codes in the encoder $L_{cw}$ | 748 | 341 |
| Number of decoders in one layer of the iterative decoding | 748 | 341 |
| Number of decoding iterations $n_{it}$ | 8 | 10 |
| Decoding Latency (bits) | 4,476,032 | 1,162,810 |

As is apparent in Table 7, the staircase code and the 3D-DTS-PrCC code may have similar code rates, but the staircase code is (e.g., much) longer and its constraint length NA is almost twice as long as that of the 3D-DTS-PrCC. Further, referring to FIG. 11, a BER performance of the two codes may (e.g., almost) coincide. However, according to embodiments, for a QD-DTS-PrCC, any of: (1) a number of encoders of the component codes; (2) a number of syndrome formers; and (3) a number of decoders of component codes of the QD-DTS-PrCC may be smaller than that (e.g., half the size) of the staircase codes. Further, all decoders of component codes with t=2 of the 3D-DTS-PrCC may have much smaller decoding complexity than that of decoders of component codes with t=4 of the staircase codes. The latency of encoding and/or decoding of the staircase codes may defined by a number of bits in an encoder's and/or decoder's EBBs of the staircase codes.

In a case where it is the beginning of decoding and QD-DTS-PrCC encoders and decoders are initialized to all-zero states, the latency of encoding and/or decoding of the staircase codes and the QD-DTS-PrCCs may be represented as:

DecLat=(number iterations)*(number of decoders in layer)*(length of the transmitted segment).

EncLat=(number of encoders in layer)*(length of the transmitted segment).

In such a case, the latencies of the codes as shown in Table 7 may be compared, and encoding latencies of the staircase code and the DTS-PrCC for the considered example may be given by:

$DecLat_{SC} = n_{it} \cdot L_{cw} \cdot n_{TS} = 8 \cdot 748^{SM} 748 = 4476032$ $DecLat_{DTS} = n_{it} \cdot L_{cw} \cdot n_{TS} = 10 \cdot 341 \cdot 341 = 1162810$ $EncLat_{SC} = L_{cw} \cdot n_{TS} = 748 \cdot 748 = 559504$ $EncLat_{DTS} = L_{cw} \cdot n_{TS} = 341 \cdot 341 = 116281$ The comparison of latencies, in such a case, makes apparent that encoding and/or decoding latencies of the 3D DTS-PrCC may be four times as small as those of the staircase code having similar same code rate.

A comparison of a latency estimation of staircase codes with that of a QD-DTS-PrCC defined by different Q-DTSs may be obtained similarly as described above. However, for such a comparison, performance of a particular QD-DTS-PrCC may (e.g., should) be analyzed (e.g., investigated, determined, etc.) in order to obtain a required $n_{it}$ for such a comparison. According to embodiments, QD-DTS-PrCCs of a different constraint length may be built based on any of: (1) choosing a proper and/or longer difference triangle set; and (2) choosing a different dimensionality Q. Such flexibility does not exist for the staircase codes. According to embodiments, the QD-DTS-PrCCs may be (e.g., much) more flexible than the staircase code, for example, due to (e.g., the possibility of) varying the constraint length of the QD-DTS-PrCC by choosing a (e.g., certain, proper, etc.) difference set.

In a case of comparing a QD-DTS-PrCC (e.g., a QD-DTS-PrCC according to embodiments described above) with LDPC codes, LDPC codes may provide (e.g., some of the most) powerful classes from among error-correcting codes having (e.g., highly) parallel decoding. However, in the case of ultra-high throughput systems with data rates higher than 400 Gb/s, the LDPC codes may not have (e.g., retain) such advantages over FEC techniques, as the main advantages of the LDPC codes are known to be apparent in the lower data rate domain, e.g. <50 Gb/s.

In the case of ultra-high throughput systems, there may be (e.g., a group of specific, typical, etc.) requirements that FEC: (1) should not have an error floor at BER≤$10^{-15}$; (2) should have a code rate R≤0.8; (3) should have a high coding gain; and (4) should have a small power consumption and complexity. Results of hardware implementations of LDPC codes with a code rate R≥0.8 have been achieved and/or reported. However, implementation results of the LDPC codes with a smaller code rate than R≤0.8 and better coding gain may not be available, for example, because of a lack of (e.g., good) implementable LDPC solutions satisfying to the noted FEC requirements.

According to embodiments, a method of encoding a QD-DTS-PrCC may include performing any of the following: (1) (e.g., first) determining a minimum number of previously encoded Encoded Bit Blocks (EBBs) to be used in generation of newly encoded codewords and transmit segments that are part of these (component) codewords, wherein an EBB may define a totality of transmit segments (TS) at a given transmission instance; (2) selecting (e.g., particular) EBBs (e.g., according to the minimum number) from the encoder memory according to an indexing method (e.g., differential triangle sets); (3) using the selected (e.g., particular) EBBs to determine a (e.g., component) codeword segment denoted as a virtual segment (VS) based on a given bit and/or symbol mapping set of rules; and (4) obtaining the newly encoded (e.g., component) codewords and the TSs using the input data/source bit stream and the determined VSs.

According to embodiments, a method of determining a VS according to a set of bit/symbol mapping rules for encoding a QD-DTS-PrCC may be such that any of: (1) transmit segments (TSs) in a (e.g., given, certain, one, etc.) EBB may not be used to compose a VS of the same EBB; (2) each bit and/or symbol of a (e.g., an arbitrary) TS in a (e.g., given, etc.) EBB may be used for composing a (e.g., only one) VS of a component codeword in other EBBs; and (3) a (e.g., only one) bit and/or symbol of a (e.g., an arbitrary) TS may be used in the composition of a VS of a (e.g., given) component codeword.

According to embodiments, there may be a method of determining a VS of QD-DTS-PrCCs having component ($n_c$, $k_c$) systematic block codes according to a bit-mapping pattern described by any of: (1) $bit'_{pos} = bit_{pos} - n_{TS}$; (2) $cw'_{pos} = (cw_{pos} + bit'_{pos}/(J-1))$ % $L_{cw}$; and (3) $layer'_{pos} = layer_{pos} - dts[bit'_{pos}$ % $(J-1)+1]$, wherein the coordinate ($layer_{pos}$, $cw_{pos}$, $bit_{pos}$) may denote each bit in a VS of a currently encoded EBB and ($layer'_{pos}$, $cw'_{pos}$, $bit'_{pos}$) may denote each bit in a VS of a previously encoded EBB stored in the encoder memory.

According to embodiments, a method of encoding a QD-DTS-PrCC may include selecting an alternating component code for encoding of consecutive EBBs; wherein component code $(n_c, n_c-r_{c,1})$ may be selected for the encoding operation at transmission instance t=I, and component code $(n_c, n_c-r_{c,2})$ may be selected for transmission instance t=i+1. Further, according to embodiments, future encoding operations may follow such an order.

CONCLUSION

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer readable medium for execution by a computer or processor. Examples of non-transitory computer-readable storage media include, but are not limited to, a read only memory (ROM), random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a UE, WTRU, terminal, base station, RNC, or any host computer.

Moreover, in the embodiments described above, processing platforms, computing systems, controllers, and other devices including the constraint server and the rendezvous point/server containing processors are noted. These devices may contain at least one Central Processing Unit ("CPU") and memory. In accordance with the practices of persons skilled in the art of computer programming, reference to acts and symbolic representations of operations or instructions may be performed by the various CPUs and memories. Such acts and operations or instructions may be referred to as being "executed," "computer executed" or "CPU executed".

One of ordinary skill in the art will appreciate that the acts and symbolically represented operations or instructions include the manipulation of electrical signals by the CPU. An electrical system represents data bits that can cause a resulting transformation or reduction of the electrical signals and the maintenance of data bits at memory locations in a memory system to thereby reconfigure or otherwise alter the CPU's operation, as well as other processing of signals. The memory locations where data bits are maintained are physical locations that have particular electrical, magnetic, optical, or organic properties corresponding to or representative of the data bits. It should be understood that the exemplary embodiments are not limited to the above-mentioned platforms or CPUs and that other platforms and CPUs may support the provided methods.

The data bits may also be maintained on a computer readable medium including magnetic disks, optical disks, and any other volatile (e.g., Random Access Memory ("RAM")) or non-volatile (e.g., Read-Only Memory ("ROM")) mass storage system readable by the CPU. The computer readable medium may include cooperating or interconnected computer readable medium, which exist exclusively on the processing system or are distributed among multiple interconnected processing systems that may be local or remote to the processing system. It is understood that the representative embodiments are not limited to the above-mentioned memories and that other platforms and memories may support the described methods.

In an illustrative embodiment, any of the operations, processes, etc. described herein may be implemented as computer-readable instructions stored on a computer-readable medium. The computer-readable instructions may be executed by a processor of a mobile unit, a network element, and/or any other computing device.

There is little distinction left between hardware and software implementations of aspects of systems. The use of hardware or software is generally (but not always, in that in certain contexts the choice between hardware and software may become significant) a design choice representing cost vs. efficiency tradeoffs. There may be various vehicles by which processes and/or systems and/or other technologies described herein may be effected (e.g., hardware, software, and/or firmware), and the preferred vehicle may vary with the context in which the processes and/or systems and/or other technologies are deployed. For example, if an implementer determines that speed and accuracy are paramount, the implementer may opt for a mainly hardware and/or firmware vehicle. If flexibility is paramount, the implementer may opt for a mainly software implementation. Alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Application Specific Standard Products (ASSPs), Field Programmable Gate Arrays (FPGAs) circuits, any other type of integrated circuit (IC), and/or a state machine.

Although features and elements are provided above in particular combinations, one of ordinary skill in the art will appreciate that each feature or element can be used alone or in any combination with the other features and elements. The present disclosure is not to be limited in terms of the particular embodiments described in this application, which are intended as illustrations of various aspects. Many modifications and variations may be made without departing from its spirit and scope, as will be apparent to those skilled in the art. No element, act, or instruction used in the description of the present application should be construed as critical or essential to the invention unless explicitly provided as such. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods or systems.

It is also to be understood that the terminology used herein is for the purpose of describing particular embodiments only, and is not intended to be limiting. As used herein, when referred to herein, the terms "user equipment" and its abbreviation "UE" may mean (i) a wireless transmit and/or receive unit (WTRU), such as described infra; (ii) any of a number of embodiments of a WTRU, such as described infra; (iii) a wireless-capable and/or wired-capable (e.g., tetherable) device configured with, inter alia, some or all structures and functionality of a WTRU, such as described infra; (iii) a wireless-capable and/or wired-capable device configured with less than all structures and functionality of a WTRU, such as described infra; or (iv) the like. Details of an example WTRU, which may be representative of any WTRU recited herein.

In certain representative embodiments, several portions of the subject matter described herein may be implemented via Application Specific Integrated Circuits (ASICs), Field Programmable Gate Arrays (FPGAs), digital signal processors (DSPs), and/or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein may be distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a CD, a DVD, a digital tape, a computer memory, etc., and a transmission type medium such as a digital and/or an analog communication medium (e.g., a fiber optic cable, a waveguide, a wired communications link, a wireless communication link, etc.).

The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality may be achieved. Hence, any two components herein combined to achieve a particular functionality may be seen as "associated with" each other such that the desired functionality is achieved, irrespective of architectures or intermediate components. Likewise, any two components so associated may also be viewed as being "operably connected", or "operably coupled", to each other to achieve the desired functionality, and any two components capable of being so associated may also be viewed as being "operably couplable" to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, where only one item is intended, the term "single" or similar language may be used. As an aid to understanding, the following appended claims and/or the descriptions herein may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"). The same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, the terms "any of" followed by a listing of a plurality of items and/or a plurality of categories of items, as used herein, are intended to include "any of," "any combination of," "any multiple of," and/or "any combination of multiples of" the items and/or the categories of items, individually or in conjunction with other items and/or other categories of items. Moreover, as used herein, the term "set" or "group" is intended to include any number of items, including zero. Additionally, as used herein, the term "number" is intended to include any number, including zero.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," "greater than," "less than," and the like includes the number recited and refers to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Moreover, the claims should not be read as limited to the provided order or elements unless stated to that effect. In addition, use of the terms "means for" in any claim is intended to invoke 35 U.S.C. § 112, ¶ 6 or means-plus-function claim format, and any claim without the terms "means for" is not so intended.

A processor in association with software may be used to implement a radio frequency transceiver for use in a wireless transmit receive unit (WTRU), user equipment (UE), terminal, base station, Mobility Management Entity (MME) or Evolved Packet Core (EPC), or any host computer. The WTRU may be used in conjunction with modules, implemented in hardware and/or software including a Software Defined Radio (SDR), and other components such as a camera, a video camera module, a videophone, a speakerphone, a vibration device, a speaker, a microphone, a television transceiver, a hands free headset, a keyboard, a Bluetooth® module, a frequency modulated (FM) radio unit, a Near Field Communication (NFC) Module, a liquid crystal display (LCD) display unit, an organic light-emitting diode (OLED) display unit, a digital music player, a media player, a video game player module, an Internet browser, and/or any Wireless Local Area Network (WLAN) or Ultra Wide Band (UWB) module.

Although the invention has been described in terms of communication systems, it is contemplated that the systems may be implemented in software on microprocessors/general purpose computers (not shown). In certain embodiments, one or more of the functions of the various components may be implemented in software that controls a general-purpose computer.

In addition, although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method performed by a wireless transmit receive unit (WTRU), including a Q-Dimensional (QD)-Difference Triangle Set (DTS) Product Convolutional Code (PrCC) encoder, for encoding a QD-DTS PrCC of an output data stream, the method comprising:
    determining a number of input bits received by each of a number of component encoders of the QD-DTS PrCC encoder;
    determining a number of available Encoded Bit Blocks (EBBs) of the QD-DTS PrCC encoder, each of the available EBBs including previously transmitted Transmit Segments (TSs) of the output data stream, wherein each of the previously transmitted TSs has a same bit length;
    generating a QD-DTS PrCC component codeword (QCC) using Q−1 EBBs of the available EBBs, wherein Q is an integer value greater than or equal to 2, and the QCC includes: (1) a new TS, (2) a number of Virtual Segments (VSs) equal to the number of the Q-1 EBBs, and (3) a number of parity bits;
    generating an output data stream including at least the new TS included in the QCC, wherein the new TS is extracted from the QCC; and
    transmitting the output data stream.

2. A method performed by a wireless transmit receive unit (WTRU) for Product Convolutional Code (PrCC) encoding, the method comprising:
    determining a plurality of input bits for each of a plurality of component encoders of a PrCC encoder;
    determining a plurality of Encoded Bit Blocks (EBBs) of the PrCC encoder, each respective EBB including a set of previously encoded first Transmit Segments (TSs);
    generating a component codeword using Q−1 EBBs of the plurality of EBBs, wherein Q is an integer value greater than or equal to 2, and the component codeword includes: (1) a second TS, (2) a number of Virtual Segments (VSs) based on the number of the Q-1 EBBs, and (3) a plurality of parity bits; and
    transmitting an output data stream including information indicating at least the second TS which is extracted from the component codeword.

3. The method of claim 2, wherein the PrCC encoder is a Q-Dimensional (QD)-Difference Triangle Set (DTS) PrCC encoder.

4. The method of claim 2, wherein each of the previously transmitted TSs has a same bit length.

5. The method of claim 2, wherein the component codeword is a Q-Dimensional (QD)-Difference Triangle Set (DTS) PrCC component codeword.

6. The method of claim 2, further comprising:
    generating the plurality of parity bits using the number of VSs which are equal to the number of the Q-1 EBBs.

7. The method of claim 2, further comprising:
    determining the set of TSs using the Q-1 EBBs of the plurality of EBBs.

8. The method of claim 2, further comprising:
    determining the Q-1 VSs based on a mapping of indices of the plurality of EBBs.

9. The method of claim 2, wherein the second TS includes information indicating the plurality of input bits and the parity bits.

10. The method of claim 2, further comprising:
    generate the parity bits based on a length and a dimension of component codes of the PrCC encoder.

11. A wireless transmit receive unit (WTRU) comprising:
    a processor and a transceiver which are configured to:
    determine a plurality of input bits for each of a plurality of component encoders of a Product Convolutional Code (PrCC) encoder, determine a plurality of Encoded Bit Blocks (EBBs) of the PrCC encoder, each respective EBB including a set of previously encoded first Transmit Segments (TSs), generate a component codeword using Q-1 EBBs of the plurality of EBBs, wherein Q is an integer value greater than or equal to 2, and the component codeword includes: (1) a second TS, (2) a number of Virtual Segments (VSs) based on the number of the Q-1 EBBs, and (3) a plurality of parity bits, and transmit an output data stream including information indicating at least the second TS which is extracted from the component codeword.

12. The WTRU of claim 11, wherein the PrCC encoder is a Q-Dimensional (QD)-Difference Triangle Set (DTS) PrCC encoder.

13. The WTRU of claim 11, wherein each of the previously transmitted TSs has a same bit length.

14. The WTRU of claim 11, wherein the component codeword is a Q-Dimensional (QD)-Difference Triangle Set (DTS) PrCC component codeword.

15. The WTRU of claim 11, wherein the processor and the transceiver are configured to:

generate the plurality of parity bits using the number of VSs which are equal to the number of the Q-1 EBBs.

16. The WTRU of claim 11, wherein the processor and the transceiver are configured to:

determine the set of TSs using the Q-1 EBBs of the plurality of EBBs.

17. The WTRU of claim 11, wherein the processor and the transceiver are configured to:

determine the Q-1 VSs based on a mapping of indices of the plurality of EBBs.

18. The WTRU of claim 11, wherein the second TS includes information indicating the plurality of input bits and the parity bits.

19. The WTRU of claim 2, wherein the processor and the transceiver are configured to:

generate the parity bits based on a length and a dimension of component codes of the PrCC encoder.

* * * * *